US006900577B2

(12) United States Patent
Takamine

(10) Patent No.: US 6,900,577 B2
(45) Date of Patent: May 31, 2005

(54) SURFACE ACOUSTIC WAVE DEVICE AND COMMUNICATION APPARATUS

(75) Inventor: Yuichi Takamine, Kanazawa (JP)

(73) Assignee: Murata Manufacturing Co, Ltd, Kyoto (JP)

( * ) Notice: Subject to any disclaimer, the term of this patent is extended or adjusted under 35 U.S.C. 154(b) by 253 days.

(21) Appl. No.: 10/353,165

(22) Filed: Jan. 28, 2003

(65) Prior Publication Data

US 2003/0169129 A1 Sep. 11, 2003

(30) Foreign Application Priority Data

Jan. 28, 2002 (JP) .......................................... 2002-018013
Nov. 29, 2002 (JP) .......................................... 2002-348944

(51) Int. Cl.⁷ ................................................ H02N 2/00
(52) U.S. Cl. ................................................ 310/313 D
(58) Field of Search ..................... 310/313 R, 313 B, 310/313 D; 333/195; H03H 9/64; H02N 2/00

(56) References Cited

U.S. PATENT DOCUMENTS 5,831,493 A * 11/1998 Ushiroku ................. 310/313 D
5,850,167 A * 12/1998 Abe ......................... 310/313 B
6,265,808 B1 * 7/2001 Taniguchi ................ 310/313 R
6,462,632 B1 * 10/2002 Fujii et al. ............... 310/313 B
6,472,959 B1 * 10/2002 Beaudin et al. .......... 310/313 B
6,700,460 B2 * 3/2004 Takamine ................... 333/195

FOREIGN PATENT DOCUMENTS

| JP | A 2001-326557 | 11/2001 | |
| JP | 2001-326557 | * 11/2001 | ............ H03H/9/64 |

* cited by examiner

*Primary Examiner*—Thomas M. Dougherty
*Assistant Examiner*—Karen Addison
(74) *Attorney, Agent, or Firm*—Keating & Bennett, LLP

(57) ABSTRACT

A plurality of surface acoustic wave filters having different center frequencies is provided on a piezoelectric substrate. Either input terminals or output terminals, or both input terminals and output terminals of the surface acoustic wave filters are integrated. Of the surface acoustic wave filters, a surface acoustic wave filter having a higher center frequency is configured so as to suppress a spurious response in the proximity of the high-frequency side in or outside a passband in the filter characteristics of a surface acoustic wave filter having a lower center frequency, for example, such that the width or pitch of electrode fingers in at least one region of reflectors differs from that in other regions.

19 Claims, 25 Drawing Sheets

SURFACE ACOUSTIC WAVE DEVICE AND COMMUNICATION APPARATUS

BACKGROUND OF THE INVENTION

1. Field of the Invention

The present invention relates to a surface acoustic wave device having a filtering function and favorable transmission characteristics, and to a communication apparatus including such a surface acoustic wave device.

2. Description of the Related Art

Use of a surface acoustic wave filter (hereinafter referred to as a SAW filter) having a reduced size as a filter in a mobile communication apparatus, such as a cellular phone, has been desirable as passband frequencies increase. The SAW filter includes a plurality of interdigital electrode transducers (hereinafter referred to as IDTs), each including a plurality of electrode fingers interdigitated with each other, disposed on a piezoelectric substrate along a direction of propagation of surface acoustic waves, and reflectors on both sides (left and right) of the IDTs in the direction of propagation.

Furthermore, in accordance with the recent trend for higher performance cellular phones, cellular phones including two or more communication systems to support operations in multiple bands have been developed. Furthermore, in accordance with the increase in the number of subscribers, systems that operate in a plurality of frequency bands, such as the PDC (Personal Digital Communications) 800 MHz band in Japan, have been developed.

In such cellular phones, interstage filters having large bandwidths are necessary; however, it is difficult to implement a low-loss and wide-band bandpass filter that covers two or more bands with a single SAW filter.

It is possible to use a single electronic component that functions as a wide-band bandpass filter including a plurality of SAW filters, for example, two SAW filters, that functions as a plurality of bandpass filters. In such an arrangement, either input terminals or output terminals, or both input terminals and output terminals of the two SAW filters are integrated in order to reduce the number of parts in a wireless signal section of a cellular phone.

In Japanese Unexamined Patent Application Publication No. 2001-326557 of the inventor of the present invention, published on Nov. 22, 2001, a one-input and one-output surface acoustic wave device (hereinafter referred to as a SAW device) for reception in the PDC 800 MHz band, having two passbands, in which input terminals and output terminals of two SAW filters having mutually different center frequencies are integrated, is disclosed.

As shown in FIG. 2, the SAW device includes a first SAW filter 1 and a second SAW filter 2. The first SAW filter 1 has a center frequency of 826.5 MHz to cover a frequency band ranging from 810 MHz to 843 MHz. The second SAW filter 2 has a center frequency of 877.5 MHz to cover a frequency band ranging from 870 MHz to 885 MHz. That is, the second SAW filter 2 has a higher center frequency than the first SAW filter 1.

Between an input terminal 3 and an input terminal of the first SAW filter 1, a surface acoustic wave resonator (hereinafter referred to as a SAW resonator) 5 is connected in series with the first SAW filter 1. Similarly, between the input terminal 3 and an input terminal of the second SAW filter 2, a SAW resonator 6 is connected in series with the second SAW filter 2. Furthermore, between a common node 8 between output terminals of the first and second SAW filters 1 and 2 and the output terminal of the second SAW filter 2, a SAW resonator 9 is connected in series with the second SAW filter 2.

Between a ground potential and a node 10 between the input terminal 3 and a node 7, an inductor 11 of an impedance matching circuit is connected. Similarly, between the ground potential and a node 12 between the node 8 and an output terminal 4, an inductor 13 of an impedance matching circuit is connected.

According to the arrangement disclosed in the publication described above, the passband of the SAW filter 1 having a lower center frequency in the filter characteristics is reduced by the design of the SAW filter 2.

The inventor has extensively researched the problem, and has found that the problem occurs because if the center frequencies of the two SAW filters 1 and 2 in the filter characteristics are close to each other, a spurious response caused in a lower side outside the passband of the SAW filter 2 having the higher center frequency affects the filter characteristics of the SAW filter 1 having the lower center frequency.

SUMMARY OF THE INVENTION

To overcome the problems described above, preferred embodiments of the present invention provide a SAW device having two passbands, in which either input terminals or output terminals, or both input terminals and output terminals are integrated to reduce the size and to significantly suppress a spurious response in a lower side outside a passband of a SAW filter having a higher center frequency to increase the width of a passband having a lower center frequency.

A preferred embodiment of the present invention provides a SAW device including a plurality of SAW filters having different center frequencies provided on a piezoelectric substrate, in which either input terminals or output terminals, or both input terminals and output terminals of the plurality of SAW filters are integrated. A SAW filter having a higher center frequency is arranged to suppress a spurious response within a passband and/or in a proximity of a high-frequency side outside the passband of a SAW filter having a lower center frequency.

According to the above-described arrangement, a SAW filter having the higher center frequency is arranged to suppress a spurious response in proximity to the high-frequency side in or outside the passband of the SAW filter having the lower center frequency. Thus, while reducing the size of the filter by integrating either the input terminals or the output terminals or both the input terminals and the output terminals of the plurality of SAW filters, the spurious response is suppressed to prevent reduction in the width of the passband of the lower center frequency, increasing the width of the passband of the relatively lower center frequency.

Another preferred embodiment of the present invention also provides a SAW device including a plurality of SAW filters having different center frequencies, provided on a piezoelectric substrate, in which either input terminals or output terminals, or both input terminals and output terminals of the plurality of SAW filters are integrated. Of the plurality of SAW filters, a SAW filter having a higher center frequency is arranged to suppress a spurious response in proximity to a low-frequency side outside a passband of the SAW filter.

According to the above-described arrangement, a SAW filter having a higher center frequency is arranged to suppress a spurious response in proximity to the low-frequency side outside the passband of the SAW filter. Thus, while reducing the size of the filter by integrating either the input terminals or the output terminals or both the input terminals and the output terminals of the plurality of SAW filters, the spurious is suppressed to prevent reduction in the width of the passband of a SAW filter having a lower center frequency, to increase the width of the passband of the lower center frequency in the filter.

In the SAW device according to preferred embodiments of the present invention, the SAW filter having the higher center frequency is preferably a longitudinally coupled SAW resonator filter.

Configurations of SAW devices according to preferred embodiments of the present invention will be described in more detail.

A first preferred embodiment of the present invention provides a SAW device including a plurality of SAW filters having different center frequencies, provided on a piezoelectric substrate, in which either input terminals or output terminals, or both input terminals and output terminals of the plurality of SAW filters are integrated. A SAW filter having a higher center frequency includes an IDT and reflectors sandwiching the IDT, and the reflectors have at least one region that differs in at least one of width and pitch of electrode fingers from the other region.

According to the above-described arrangement, the SAW filter having the higher center frequency includes the IDT and the reflectors sandwiching the IDT, and the reflectors have at least one region that differs in at least one of width and pitch of electrode fingers from the other region (i.e., nearby electrodes in the reflectors). Thus, the SAW device has an increased passband width in a SAW filter having lower center frequency, and the size of the SAW device is reduced since either the input terminals or the output terminals or both the input terminals and the output terminals of the plurality of SAW filters having different center frequencies are integrated.

A second preferred embodiment of the present invention provides a SAW device including a plurality of SAW filters having different center frequencies, provided on a piezoelectric substrate, in which either input terminals or output terminals, or both input terminals and output terminals of the plurality of SAW filters are integrated, wherein a SAW filter having a higher center frequency includes an IDT and reflectors sandwiching the IDT, the reflectors are divided into at least two regions, and at least one of the divided regions differs in duty from the other regions.

According to the above-described arrangement, the SAW filter having the higher center frequency includes the IDT and the reflectors sandwiching the IDT, the reflectors are divided into at least two regions, and at least one of the divided regions differs in duty from the other regions. Thus, the SAW device has an increased passband width in a SAW filter having a lower center frequency, and the size of the SAW device is reduced since either the input terminals or the output terminals or both the input terminals and the output terminals of the plurality of SAW filters having mutually different center frequencies are integrated.

A third preferred embodiment of the present invention provides a SAW device including a plurality of SAW filters having different center frequencies, provided on a piezoelectric substrate, in which either input terminals or output terminals, or both input terminals and output terminals of the plurality of SAW filters are integrated, wherein a SAW filter having a higher center frequency includes an IDT and reflectors sandwiching the IDT, and electrode fingers of the reflectors vary in length in accordance with distance from the IDT.

According to the above-described arrangement, the SAW filter having the higher center frequency includes the IDT and the reflectors sandwiching the IDT, and the electrode fingers of the reflectors differ in length, for example, become shorter, in accordance with distance from the IDT. Thus, the SAW device has an increased passband width in a SAW filter having a lower center frequency, and the size of the SAW device is reduced since either the input terminals or the output terminals or both the input terminals and the output terminals of the plurality of SAW filters having mutually different center frequencies are integrated.

A fourth preferred embodiment of the present invention provides a SAW device including a plurality of SAW filters having different center frequencies, provided on a piezoelectric substrate, in which either input terminals or output terminals, or both input terminals and output terminals of the plurality of SAW filters are integrated, wherein a SAW filter having a higher center frequency includes a first reflector and a second reflector that differ in configuration from each other, and an IDT sandwiched by the first and second reflectors.

According to the above-described arrangement, the SAW filter having the higher center frequency includes the first reflector and the second reflector that have different configurations from each other, and the IDT sandwiched by the first and second reflectors. Thus, the SAW device has an increased passband width in a SAW filter having a lower center frequency, and the size of the SAW device is reduced since either the input terminals or the output terminals or both the input terminals and the output terminals of the plurality of SAW filters having mutually different center frequencies are integrated.

In the SAW device according to the fourth preferred embodiment of the present invention, the first and second reflectors may differ in duty from each other.

Also, in the SAW device according to the fourth preferred embodiment of the present invention, the first and second reflectors may differ in number of electrode fingers from each other.

Also, in the SAW device according to the fourth preferred embodiment of the present invention, the first and second reflectors may differ in pitch of electrode fingers from each other.

Also, in the SAW device according to the fourth preferred embodiment of the present invention, distances between centers of outermost electrode fingers of the first and second reflectors and IDTs respectively adjacent thereto may differ from each other. The above specific features of the fourth preferred embodiment of the present invention may be combined as desired.

A fifth preferred embodiment of the present invention provides a SAW device including a plurality of SAW filters having different center frequencies, provided on a piezoelectric substrate, in which either input terminals or output terminals, or both input terminals and output terminals of the plurality of SAW filters are integrated, wherein a SAW filter having a higher center frequency includes two or more SAW filter sections cascade-connected with each other, each including an IDT and reflectors sandwiching the IDT, and the reflectors differ in configuration among the cascade-connected SAW filter sections.

According to the above-described arrangement, the SAW filter having the higher center frequency includes two or more SAW filter sections cascade-connected with each other, each including an IDT and reflectors sandwiching the IDT, and the reflectors differ in configuration among the cascade-connected SAW filter sections. Thus, the SAW device has an increased passband width in a SAW filter having a lower center frequency, and the size of the SAW device is reduced since either the input terminals or the output terminals or both the input terminals and the output terminals of the plurality of SAW filters having mutually different center frequencies are integrated.

In the SAW device according to the fifth preferred embodiment of the present invention, the reflectors may differ in duty among the cascade-connected SAW filter sections.

Also, in the SAW device according to the fifth preferred embodiment of the present invention, the reflectors may differ in number of electrode fingers among the cascade-connected SAW filter sections.

Also, in the SAW device according to the fifth preferred embodiment of the present invention, the reflectors may differ in pitch of electrode fingers among the cascade-connected SAW filter sections.

Also, in the SAW device according to the fifth preferred embodiment of the present invention, distances between centers of outermost electrode fingers of the reflectors and IDTs respectively adjacent thereto may differ among the cascade-connected SAW filter sections. The above specific features of the fifth preferred embodiment of the present invention may be combined as desired.

Preferably, in each of the SAW devices according to the first to fifth preferred embodiments of the present invention, at least one SAW resonator is connected between the integrated terminal and the plurality of SAW filters.

Also preferably, in each of the SAW devices according to the first to fifth preferred embodiments of the present invention, an inductance element is arranged substantially parallel to the integrated terminal.

Another preferred embodiment of the present invention provides a communication apparatus including a SAW device according to any of the preferred embodiments described above.

Since the above-described arrangement includes a SAW device that suppresses and minimizes a spurious response to prevent reduction in the passband width of a SAW filter having a lower center frequency, communication characteristics are greatly improved.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

SAW devices according to preferred embodiments of the present invention will now be described with reference to FIGS. 1 to 24. The description will be made in the context of SAW devices that simultaneously cover receiving frequency bands of the PDC 800 MHz band, i.e., 810 MHz to 843 MHz and 870 MHz to 885 MHz.

Figure 1:
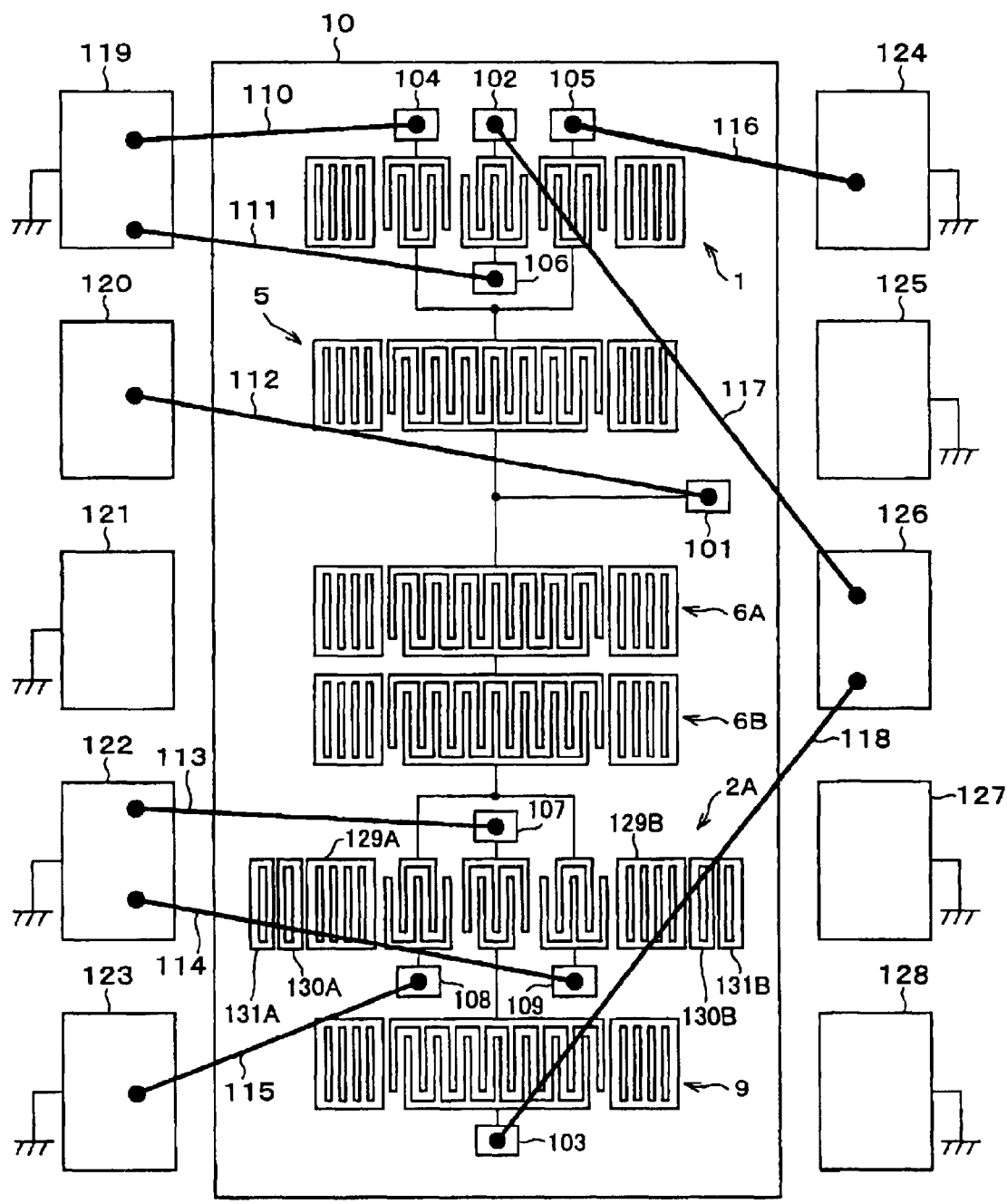
FIG. 1 is a schematic diagram showing the configuration of a SAW device according to a first preferred embodiment of the present invention.
Figure 2:
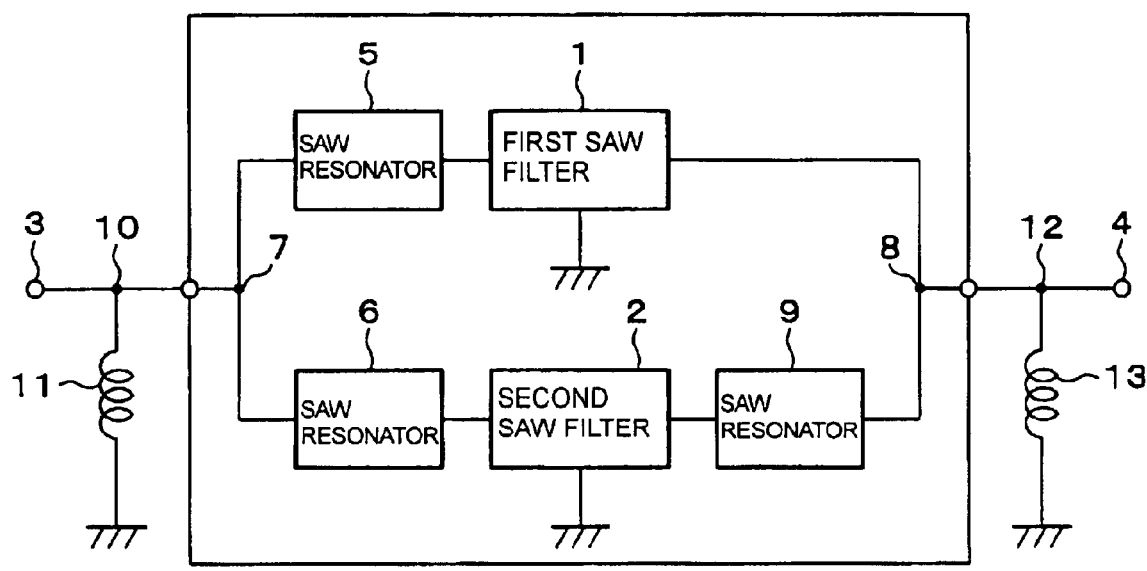
FIG. 2 is a schematic diagram showing the configuration of a SAW device according to the related art, in which input terminals and output terminals of two SAW filters are integrated.

FIG. 2 is a diagram showing the configuration of a SAW device according to the related art. The configuration of a SAW device according to preferred embodiments of the present invention is the same as the basic configuration shown in FIG. 2 except for features of preferred embodiments of the present invention, which will be described below with reference to FIG. 1.

With regard to the preferred embodiments of the present invention, elements having the same functions as the SAW filters, SAW resonators, and other elements shown in FIG. 2 are denoted in FIG. 1 by the same reference numerals as in FIG. 2, and descriptions thereof will be omitted. Note, however, the SAW resonator 6 is divided into two segments due to design considerations, which will be denoted by 6A and 6B, respectively. In subsequent figures, for simplicity and ease of understanding, the number of electrode fingers of IDTs and reflectors are shown as less than the actual numbers thereof.

First Preferred Embodiment

According to a first preferred embodiment of the present invention, a 40±5° Y-cut X-propagating LiTaO$_3$ substrate is preferably used as a piezoelectric substrate 10, on which SAW filters 1 and 2A and SAW resonators 5, 6A, 6B, and 9 are preferably made of aluminum electrodes. In the first preferred embodiment, each of the SAW filters 1 and 2A is defined by three IDTs and reflectors sandwiching the IDTs, defining a 3-IDT, longitudinally coupled SAW resonator filter, and each of the SAW resonators is preferably defined by an IDT and reflectors sandwiching the IDT.

Although the arrangement including reflectors on both sides of an IDT is preferred for each of the SAW resonators to achieve a higher Q factor, the reflectors may be omitted without causing problems in operation.

In the SAW device according to the first preferred embodiment, bonding wires 110 to 118 made of, for example, aluminum, are provided to electrically connect electrode pads 101 to 109 provided on the piezoelectric substrate 10 with electrode pads 119 to 128 of a package. In the SAW device, the electrode pad 101 functions as an input terminal of the SAW filters 1 and 2A, and the electrode pads 102 and 103 function output terminals of the SAW filters 1 and 2A.

With regard to the electrode pads 119 to 128 of the package, the electrode pad 120 functions as an input terminal of the SAW device, the electrode pad 126 functions as an output terminal thereof, and the other electrode pads are grounded. In FIG. 1, input terminals of the SAW filters 1 and 2A are integrated on the piezoelectric substrate 10, and output terminals thereof are integrated on the electrode pad 126. The arrangement may be reversed, or both of the input terminals and the output terminals may be integrated on the piezoelectric substrate 10 or on electrode pads of the package.

Furthermore, although two SAW filters 1 and 2A and four SAW resonators 5, 6A, 6B, and 9 are provided on the single piezoelectric substrate 10 in FIG. 1, these components may be separately provided on two or more piezoelectric substrates. Furthermore, although electrical connection between the piezoelectric substrate 10 and the electrode pads 119 to 128 of the package is preferably achieved by wire bonding in FIG. 1, alternatively, electrical connection in the SAW device may be achieved by bump bonding or other suitable means.

The inductors 11 and 13 in FIG. 2 have inductances of about 10 nH and about 12 nH, respectively, and are externally connected to the package. Alternatively, the inductors 11 and 13 may be provided inside the package.

A feature of the first preferred embodiment is that the reflectors of the SAW filter 2A are divided into three segments 129A to 131A and 129B to 131B, respectively. Table 1 shows specific designs of the SAW filters 1 and 2A and the SAW resonators 5, 6A, 6B, and 9.

TABLE 1

|  | SAW filter 1 | SAW filter 2A | SAW resonator 5 | SAW resonator 6A | SAW resonator 6B | SAW resonator 9 |
|---|---|---|---|---|---|---|
| Apodization width (μm) | 250 | 320 | 50 | 60 | 60 | 60 |
| Number of electrode fingers of IDT | 9/14/9 | 12/17/12 | 100 | 100 | 100 | 100 |
| Operating wavelength of IDT (μm) | 4.74 | 4.52 | 4.69 | 4.40 | 4.40 | 4.39 |
| Operating wavelength of reflector (μm) | 4.89 | 4.55 | 4.69 | 4.40 | 4.40 | 4.39 |
| Duty of IDT | 0.75 | 0.75 | 0.50 | 0.70 | 0.70 | 0.70 |
| Duty of reflector | 0.55 | 0.55 | 0.50 | 0.70 | 0.70 | 0.70 |
| Distance between IDTs | 0.28 λI | 0.33 λI | — | — | — | — |
| Distance between IDT and reflector | 0.55 λR | 0.55 λR | 0.50 λR | 0.50 λR | 0.50 λR | 0.50 λR |

TABLE 1-continued

|  | SAW filter 1 | SAW filter 2A | SAW resonator 5 | SAW resonator 6A | SAW resonator 6B | SAW resonator 9 |
|---|---|---|---|---|---|---|
| Number of electrode fingers of reflector | 50 | 60 | 30 | 30 | 30 | 30 |
| Thickness of Al film | 0.080 λI | 0.084 λI | 0.081 λI | 0.086 λI | 0.086 λI | 0.086 λI |

The term "pitch" in Table 1 refers to the distance between the centers of outermost electrode fingers of IDTs or an IDT and a reflector adjacent to each other. λI in Table 1 denotes an operating wavelength (μm) of an IDT, and λR in Table 1 denotes an operating wavelength (μm) of a reflector.

Although not shown, IDTs of the SAW resonators 6A, 6B, and 9 are preferably withdrawal-weighted. The withdrawal weighting, however, is used only to improve sharpness in a frequency range above a passband, and is not directly relevant to the present invention. Thus, advantages of various preferred embodiments of the present invention are achieved without withdrawal weighting.

Table 1 shows that the number of electrode fingers of each of the reflectors of the SAW filter 2A is preferably 60, which refers to the total number of electrode fingers of each of the reflectors. More specifically, each of the reflectors is divided into 54, 4, and 2 electrode fingers in order of proximity to the IDTs, and the distance between the centers of outermost electrode fingers of the 54 electrode fingers and the 4 electrode fingers is preferably about 0.46 λR, and the distance between the centers of outermost electrode fingers of the 4 reflectors and the 2 reflectors is preferably about 0.40 λR.

Figure 3A:
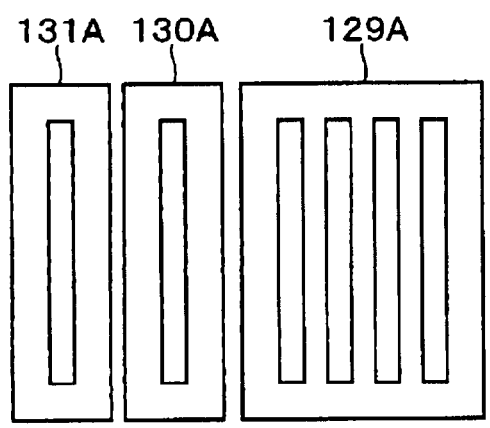
FIGS. 3A and 3B are enlarged schematic diagrams showing the configurations of reflectors in the SAW device according to the first preferred embodiment, FIG. 3A showing a reflector in segments and FIG. 3B showing reflectors in which distance between adjacent electrode fingers is varied instead of segmentation.

In FIG. 1, each of the reflectors is divided as shown in FIG. 3A. This is equivalent to an arrangement shown in FIG. 3B, in which the bus bars are integrated for each of the reflectors, and in which a distance 201 between the centers of adjacent electrode fingers corresponding to the outermost electrode fingers of the reflector segments 129A and 130A in FIG. 3A is preferably about 0.46 λR and a distance 202 between the centers of adjacent electrode fingers corresponding to the outermost electrode fingers of the reflector segments 130A and 131A in FIG. 3A is preferably about 0.40 λR. That is, distances between some pairs of adjacent electrode fingers of the reflectors are different from the distance between the other pairs of adjacent electrode fingers of the reflectors.

Figure 4:
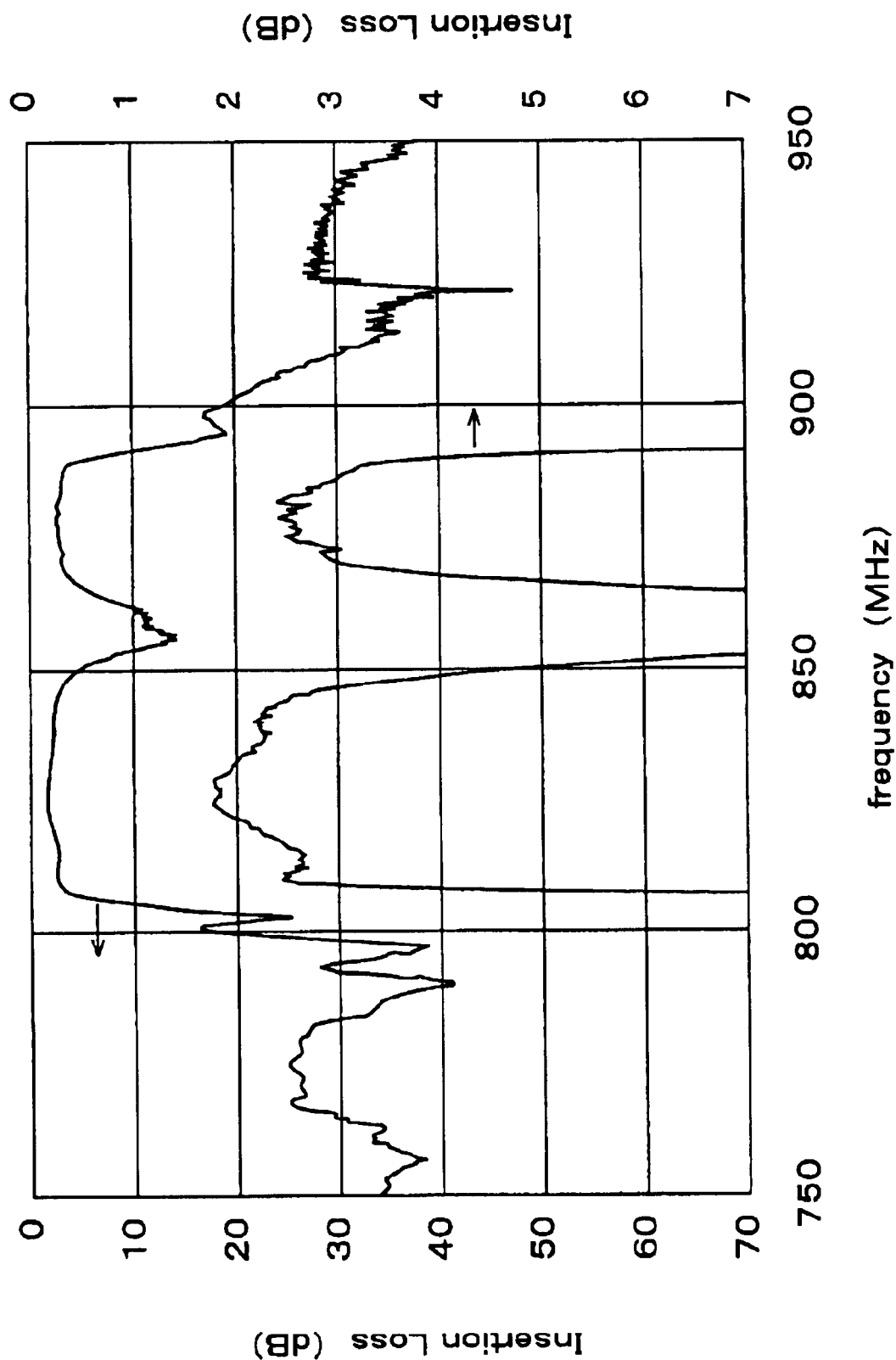
FIG. 4 is a graph showing frequency-transmission characteristics in the first preferred embodiment of the present invention.
Figure 5:
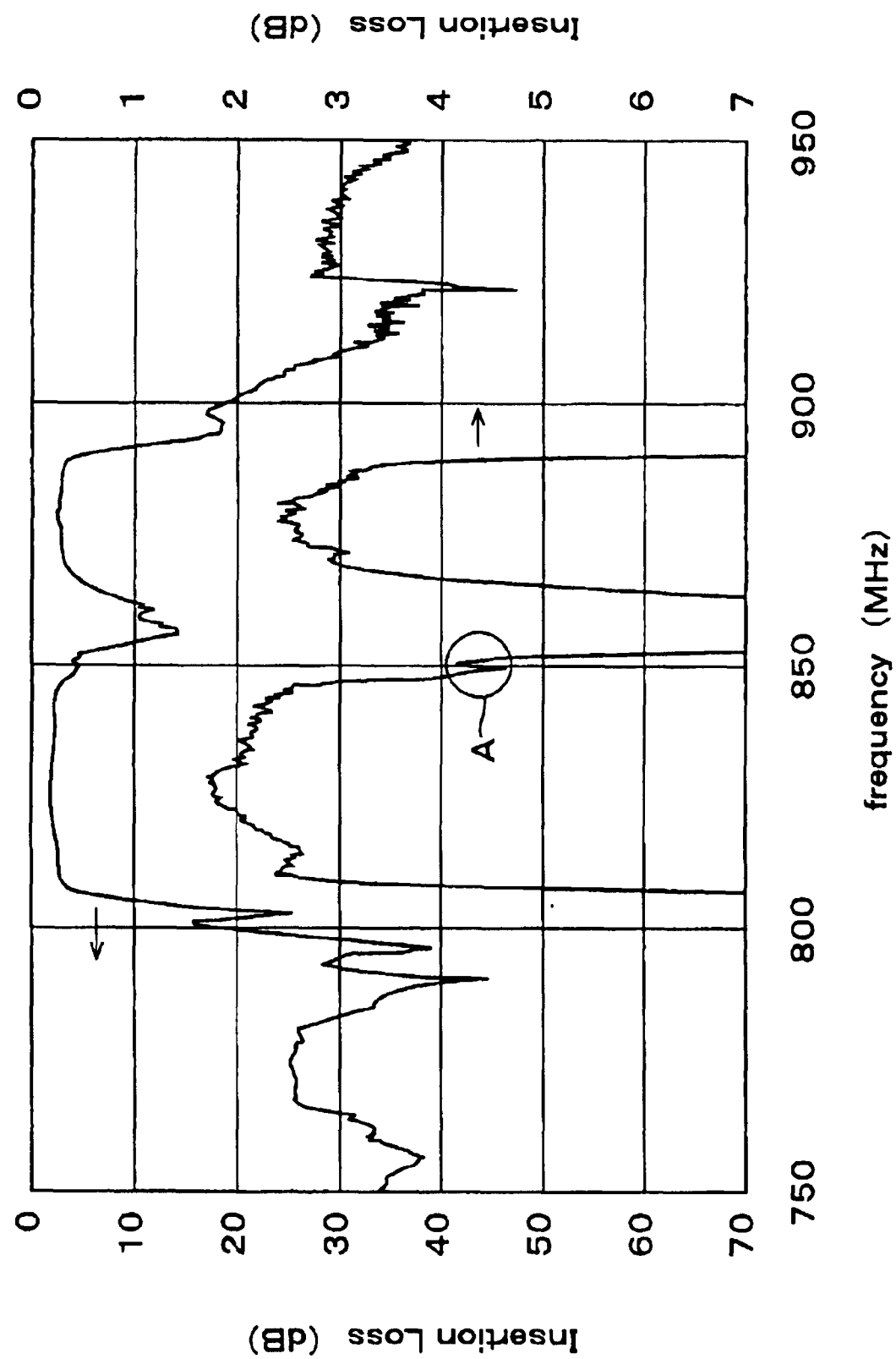
FIG. 5 is a graph showing frequency-transmission characteristics of a comparative example.
Figure 6:
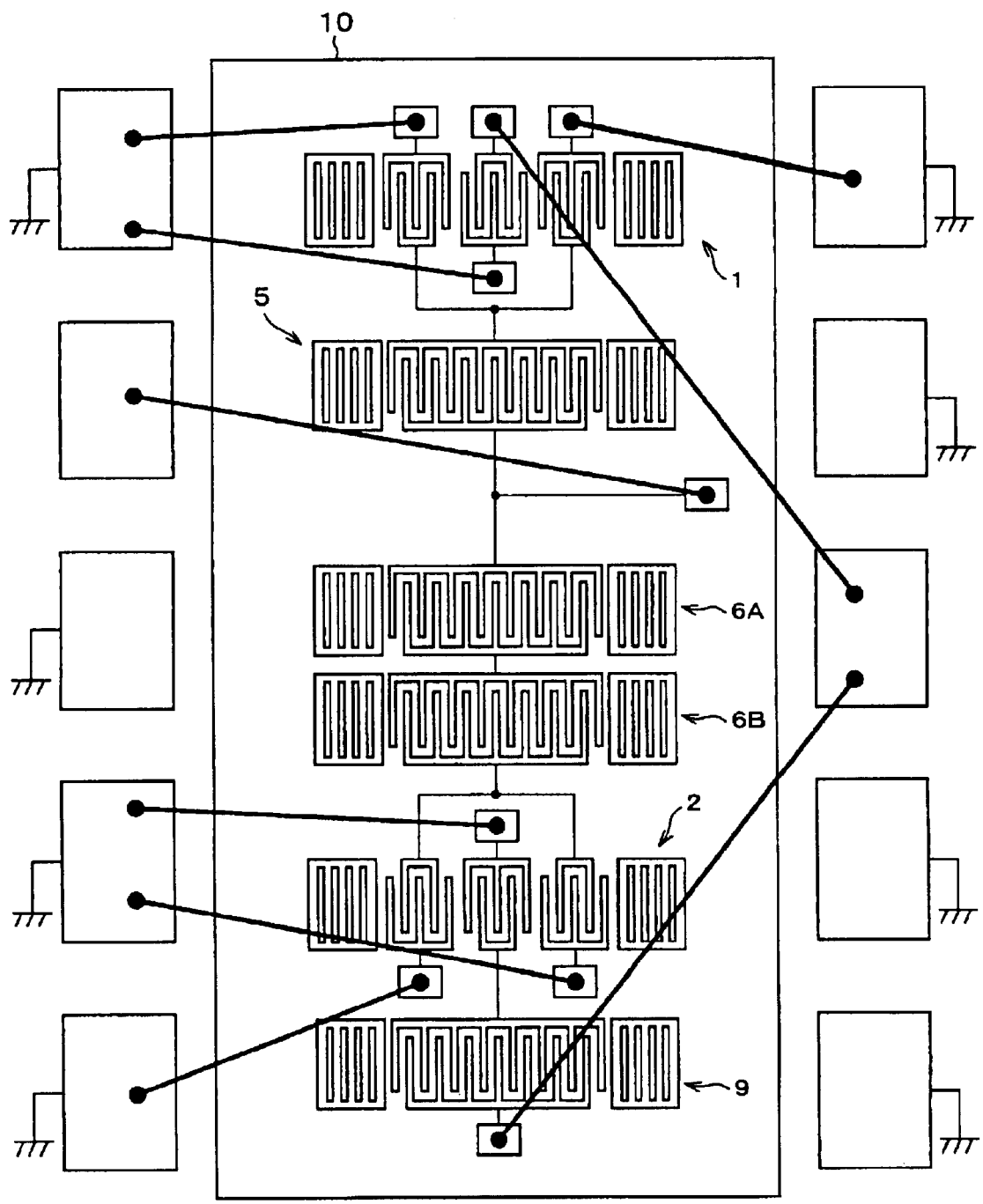
FIG. 6 is a schematic diagram showing the configuration of a SAW device of the comparative example.

Next, operations and advantages of preferred embodiments of the present invention will be described. FIG. 4 is a graph showing frequency-transmission characteristics of the first preferred embodiment. FIG. 5 is a graph showing frequency-transmission characteristics of a SAW device for comparison, shown in FIG. 6, in which input terminals and output terminals of two SAW filters having different center frequencies are integrated. The comparative example shown in FIG. 6 is designed the same as the SAW device shown in FIG. 1 except that the reflectors of the SAW filter 2 are not divided.

As will be seen from a comparison between the transmission characteristics of the first preferred embodiment and the comparative example, a spurious response A is produced in the proximity of the high-frequency side of a lower passband of the comparative example, while such a spurious response is not produced in the first preferred embodiment.

Accordingly, the passband width of the lower passband in the first preferred embodiment is greater as compared with the comparative example. Considering the bandwidth from through level to of about 4.0 dB of the relatively lower passband in the filter characteristics, the bandwidth is approximately 39.5 MHz in the comparative example, while the bandwidth is approximately 41.0 MHz, that is, about 1.5 MHz larger, in the first preferred embodiment. Accordingly, tolerance for variation in frequency due to variation caused in manufacturing is increased, which greatly improves yield.

Figure 7A:
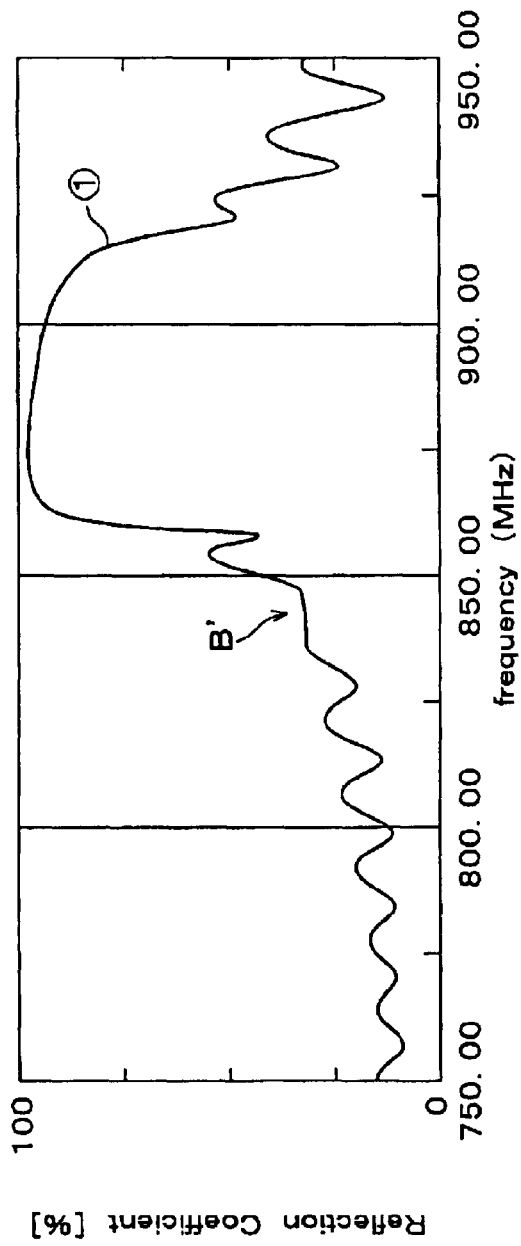
FIGS. 7A and 7B are graphs for explaining the principle of preferred embodiments of the present invention, FIG. 7A showing reflection characteristics of reflectors in the SAW device according to the first preferred embodiment and FIG. 7B showing reflection characteristics of reflectors in the SAW device of the comparative example.
Figure 7B:
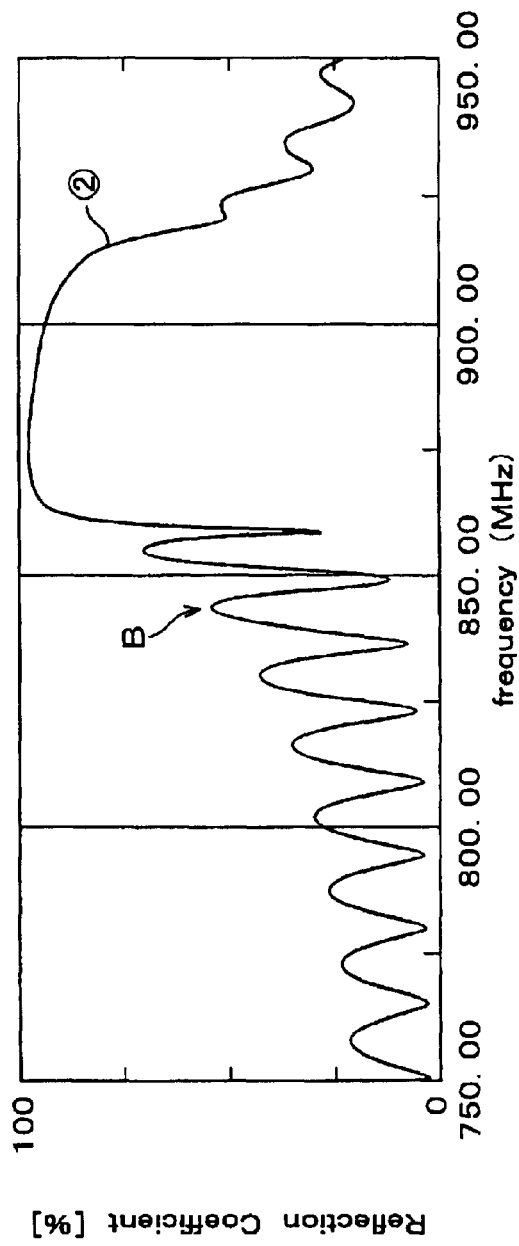

The reasons for the advantages of the first preferred embodiment will be described below. FIGS. 7A and 7B are graphs showing simulated reflection coefficients of reflectors in relation to frequency in the first preferred embodiment and in the comparative example, respectively.

In an ideal reflector (having an infinite number of electrode fingers, and causing no propagation loss), a reflection coefficient is 100% in a frequency band having a certain width, and reflection coefficient is 0% outside the frequency band. The frequency band that is reflected is referred to as a stopband. In reality, however, the number of electrode fingers of a reflector is finite, and propagation loss exists. Thus, reflection coefficient is not 100% in the stopband, and a frequency band in which reflection coefficient is not 0% exists outside the stopband.

Referring to a graph (2) of reflection coefficient of the reflectors in relation to frequency in the comparative example, shown in FIG. 7B, the region of the spurious response A in the frequency-transmission characteristics of the comparative example corresponds to a region B having a large reflection coefficient. That is, in the SAW filter 2, a surface acoustic wave is reflected in the region to cause a spurious response, and the region is close to the passband of the SAW filter 1 having the lower center frequency, such that the passband of the SAW filter 1 decreases.

In contrast, according to the first preferred embodiment, via adjustment by division of the reflectors, the reflection coefficient is greatly reduced in a region B' of a graph (1) shown in FIG. 7A. Accordingly, in the SAW filter 2, reflection of a surface acoustic wave in the region is greatly suppressed. Thus, a spurious response is not caused in the SAW filter 2, which greatly reduces the effect on the filter characteristics of the SAW filter 1 having the lower center frequency.

As described above, in the first preferred embodiment, either input terminals or output terminals, or both input terminals and output terminals of the 3-IDT longitudinally coupled SAW resonator filters 1 and 2A having different center frequencies are integrated, and of the SAW filters 1 and 2A, the reflectors of the SAW filter 2A having a higher center frequency are divided such that a distance between adjacent electrode fingers in a region is different from that in other regions.

According to the arrangement in which the reflectors of the SAW filter 2A are divided such that a distance between adjacent electrode fingers in a region is different from that in other regions, the passband of the SAW filter 1 having the lower center frequency is greatly increased as compared with the related art, which greatly improves yield of SAW devices.

Although 3-IDT longitudinally coupled SAW resonator filters are preferably used as two SAW filters having different center frequencies in the first preferred embodiment, without limitation thereto, the advantages of the present invention are similarly achieved using, for example, 2-IDT longitudinally coupled SAW resonator filters, or longitudinally coupled SAW resonator filters including a plurality of IDTs, such as five IDTs or seven IDTs.

Furthermore, a SAW filter having a lower center frequency need not be a longitudinally coupled SAW resonator filter, and the advantages of the present invention are achieved using, for example, a ladder filter including a plurality of SAW resonators connected to each other in a ladder arrangement, a transversal filter, or other types of SAW filters.

Although the first preferred embodiment has been described in the context of an arrangement in which the distance between adjacent electrode fingers in a region is different from that in other regions, the advantages of the present invention are similarly achieved with an arrangement in which the width of electrode fingers is different from that in other regions. The features of the arrangements and various preferred embodiments may also be mixed and combined.

In the preferred embodiments to be described below, arrangements and methods for suppressing spurious responses, different from those of the first preferred embodiment, are preferably used. With regard to the preferred embodiments to be described below, only elements that differ from those in the first preferred embodiment are shown, and common elements are not shown.

Second Preferred Embodiment

Figure 8:
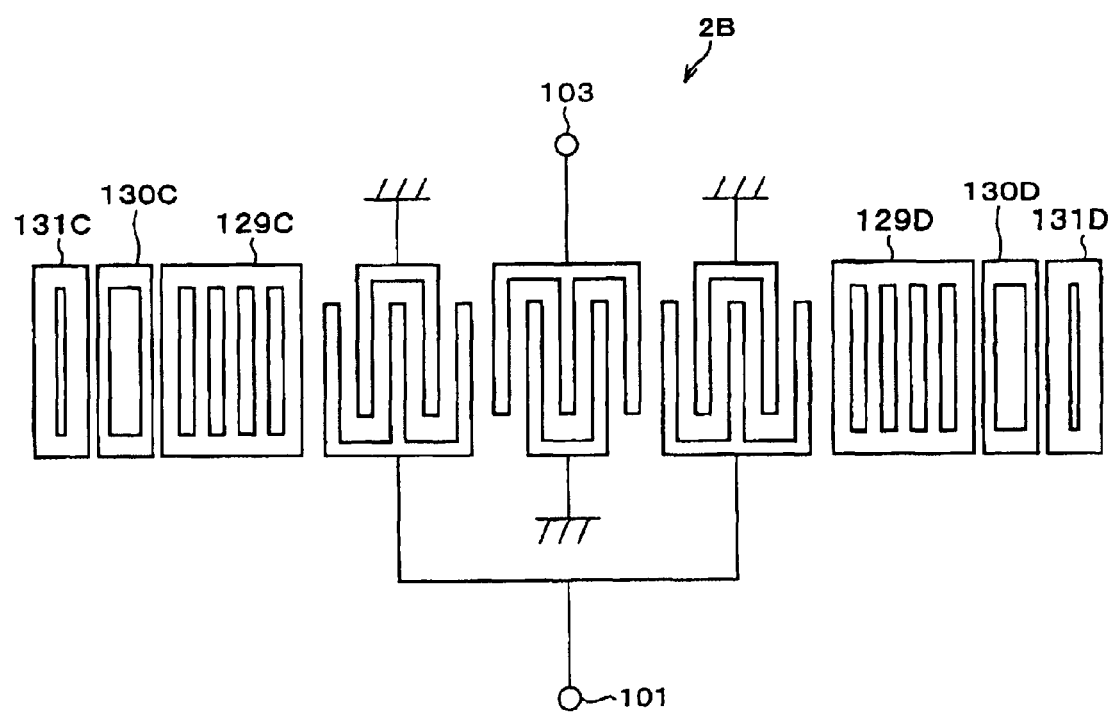
FIG. 8 is a schematic diagram showing the configuration of a SAW filter having a higher center frequency in a SAW device according to a second preferred embodiment of the present invention.

FIG. 8 shows a SAW filter 2B having a higher center frequency in a second preferred embodiment of the present invention. A feature of the second preferred embodiment is that, similarly to the first preferred embodiment, the reflectors of the SAW filter 2B having the higher center frequency are divided into reflector segments 129C to 131C and 129D to 131D, respectively, and the duty of electrode fingers differs among the segments.

Figure 3B:
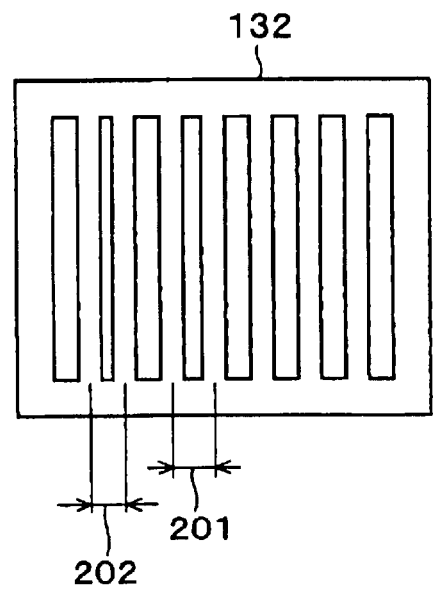

That is, each of the reflectors has a partial region in which the duty of electrode fingers differs from that in other regions. Although separate bus bars are provided for the respective segments in FIG. 8, an integrated bus bar may also be used, as shown in FIG. 3B.

The operations and advantages of the second preferred embodiment will be described below. Since the SAW filter 2B shown in FIG. 8 has a higher center frequency, similar to the first preferred embodiment, a spurious response in the proximity of a lower center frequency is suppressed, such that the passband having the lower center frequency is greatly increased.

Third Preferred Embodiment

Figure 9:
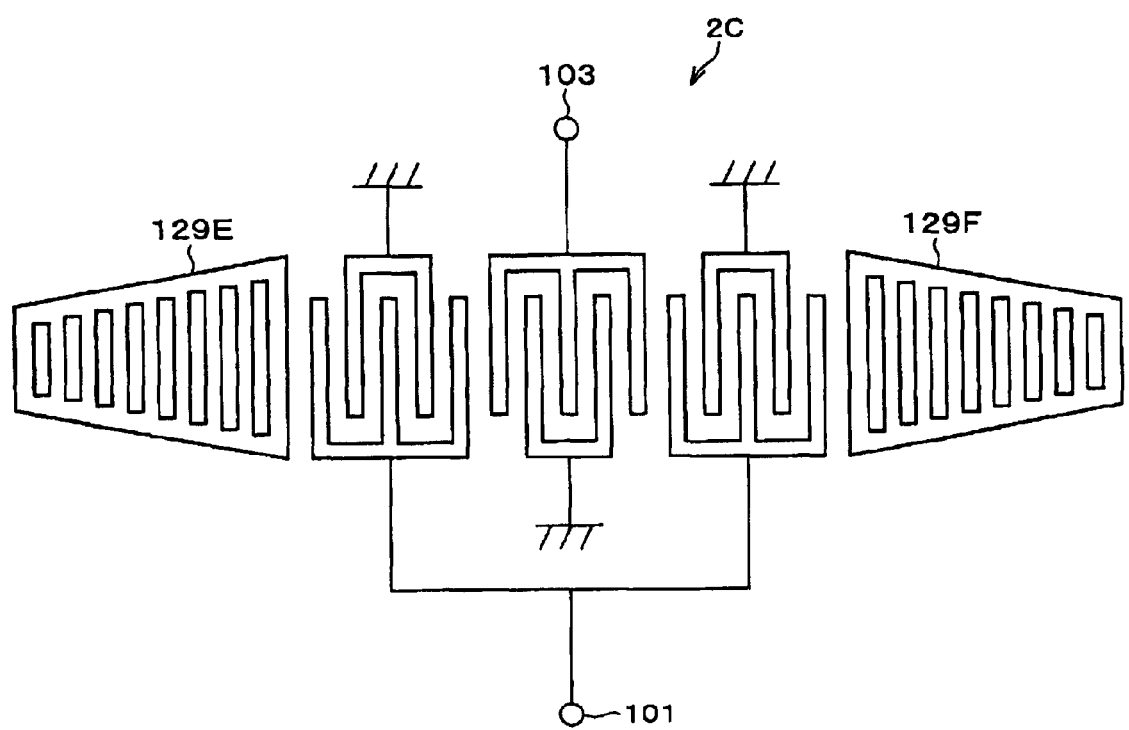
FIG. 9 is a schematic diagram showing the configuration of a SAW filter having a higher center frequency in a SAW device according to a third preferred embodiment of the present invention.

FIG. 9 shows a SAW filter 2C having a higher center frequency in a third preferred embodiment of the present invention. A feature of the third preferred embodiment is that electrode fingers of reflectors 129E and 129F of the SAW filter 2C having the higher center frequency become gradually shorter the electrode fingers extend away from sandwiched IDTs.

Preferably, the electrode fingers of the reflectors 129E and 129F change in length so as to maintain equal distances with respect to a center line along a direction of propagation of a surface acoustic wave (SAW) in the IDTs, that is, so as to maintain symmetry with respect to the center line. Although the electrode fingers of the reflectors 129E and 129F become gradually shorter as the electrode fingers extend away from the sandwiched IDTs in the above example, the electrode fingers may become gradually longer.

The operations and advantages of the third preferred embodiment will be described below. Since the SAW filter 2C shown in FIG. 9 has a higher center frequency, similar to the first preferred embodiment, a spurious response in the proximity of a lower center frequency is greatly suppressed, such that the passband of the SAW filter 1 having the lower center frequency is greatly increased.

Fourth Preferred Embodiment

Figure 10:
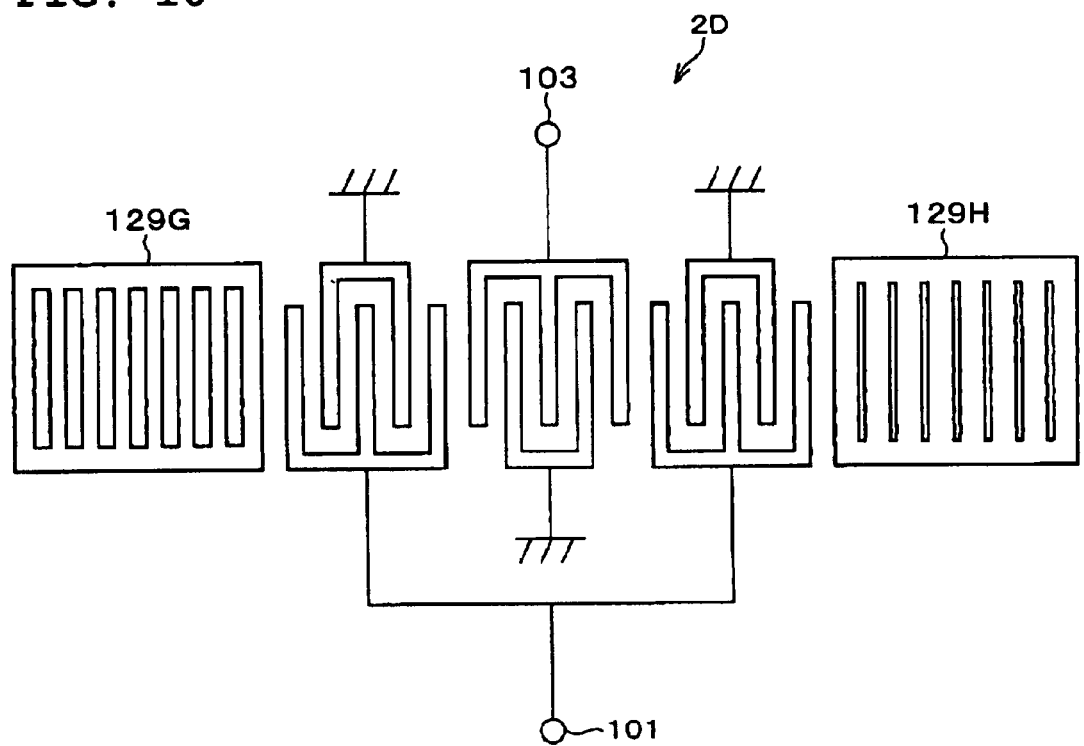
FIG. 10 is a schematic diagram showing the configuration of a SAW filter having a higher center frequency in a SAW device according to a fourth preferred embodiment of the present invention.

FIG. 10 shows a SAW filter 2D having a higher center frequency in a fourth preferred embodiment of the present invention. A feature of the fourth preferred embodiment is that duties of left and right reflectors 129G and 129H of the SAW filter 2D having the higher center frequency are different from each other, that is, the configurations of the left and right reflectors 129G and 129H are different from each other.

The operations and advantages of the fourth preferred embodiment will be described below. Since the SAW filter 2D shown in FIG. 10 has a higher center frequency, similar to the first preferred embodiment, a spurious response in the proximity of a lower center frequency is suppressed, such that the passband having the lower center frequency in the filter characteristics is greatly increased.

Figure 11:
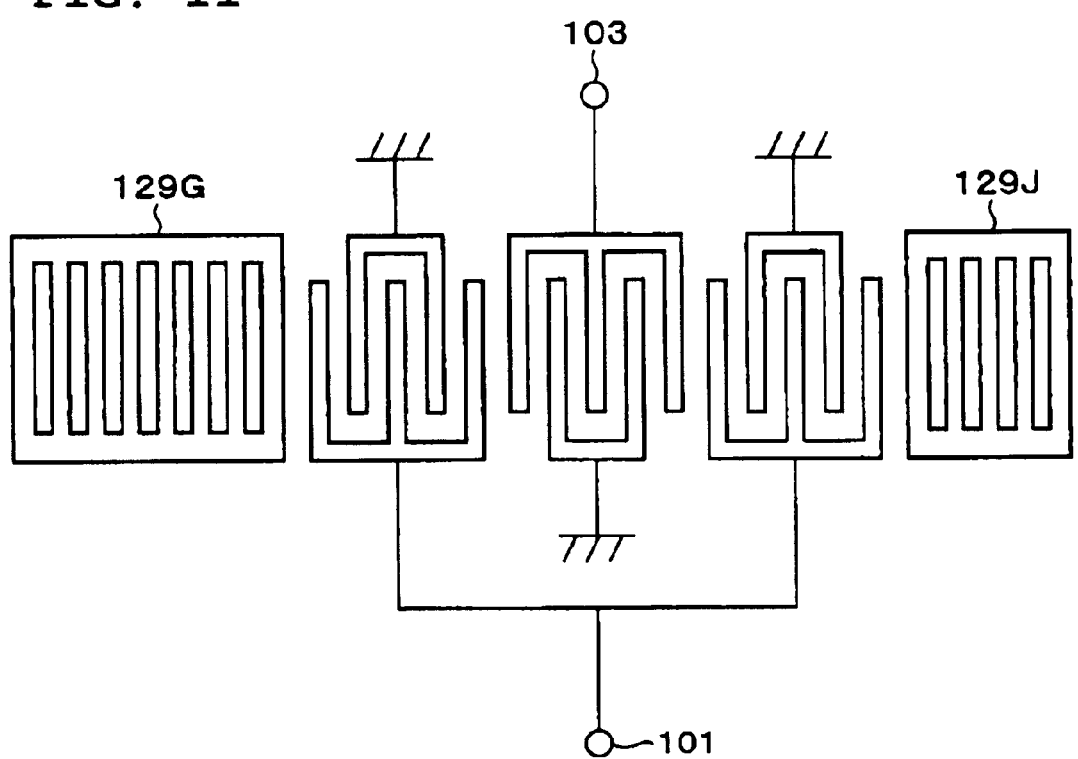
FIG. 11 is a schematic diagram showing the configuration of a modification of the SAW filter according to the fourth preferred embodiment of the present invention.
Figure 12:
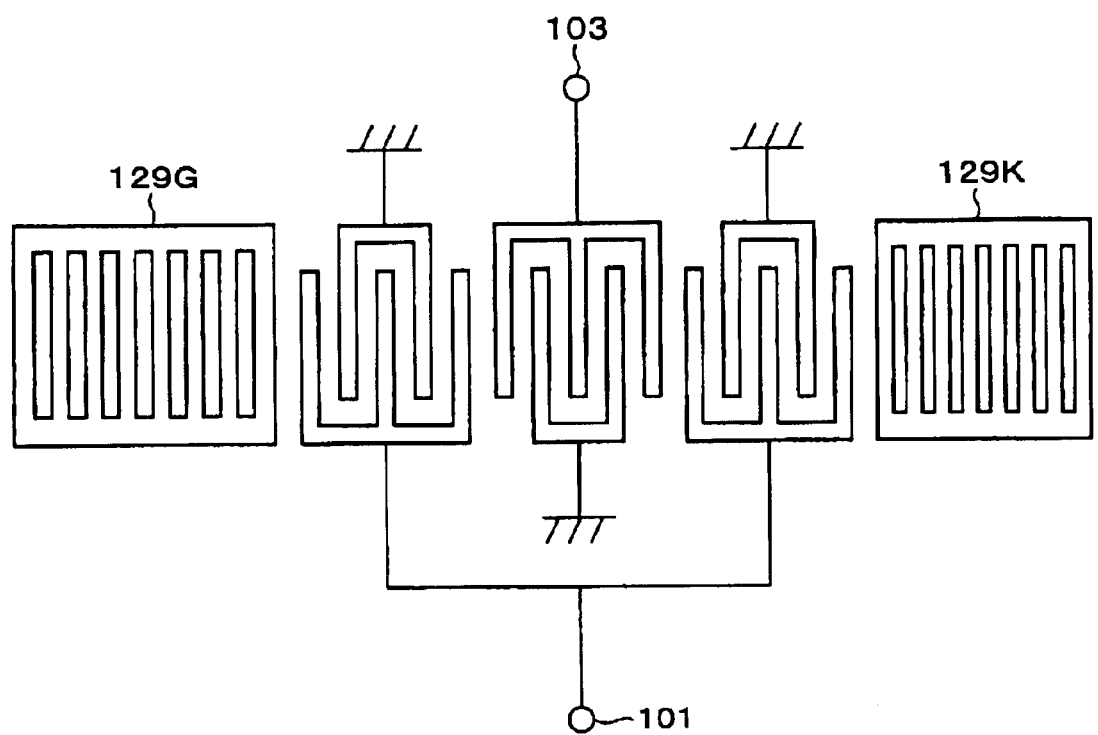
FIG. 12 is a schematic diagram showing the configuration of another modification of the SAW filter according to the fourth preferred embodiment of the present invention.
Figure 13:
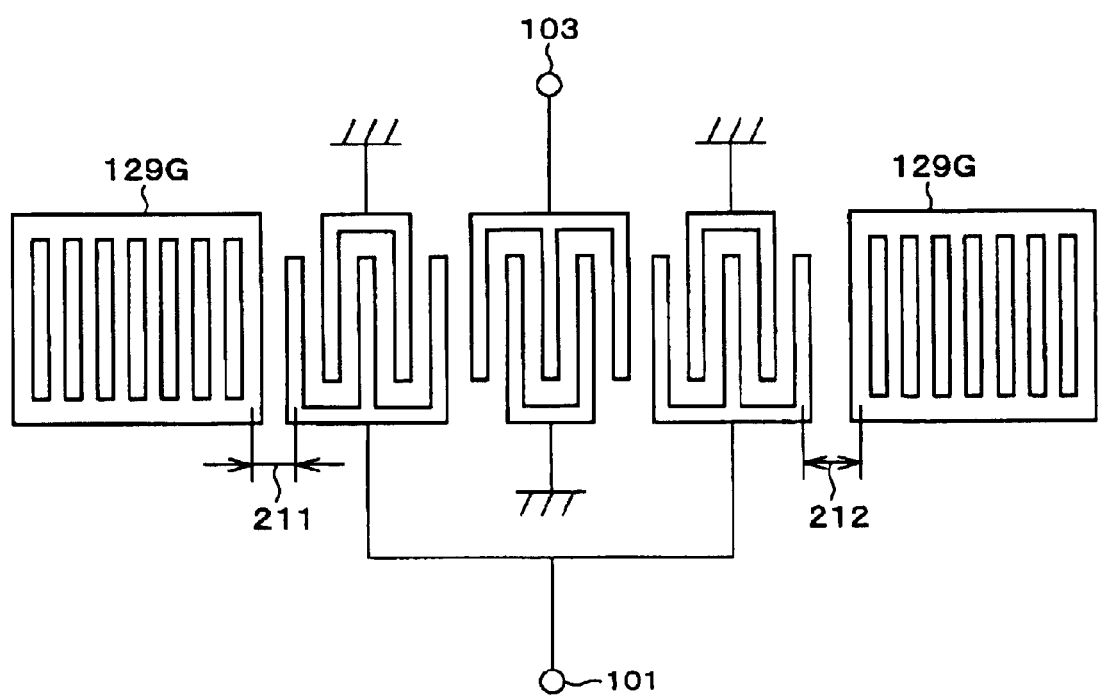
FIG. 13 is a schematic diagram showing the configuration of yet another modification of the SAW filter according to the fourth preferred embodiment of the present invention.

As other examples of different configurations of the left and right reflectors, the arrangement may be such that the number of electrode fingers differs between left and right reflectors 129G and 129J, as shown in FIG. 11, or the arrangement may be such that the pitch of electrode fingers differs between left and right reflectors 129G and 129K, as shown in FIG. 12. The advantages are similarly achieved even if distances 211 and 212 between the centers of outermost electrode fingers of reflectors 129G and IDTs adjacent thereto are different from each other, as shown in FIG. 13.

Fifth Preferred Embodiment

Figure 14:
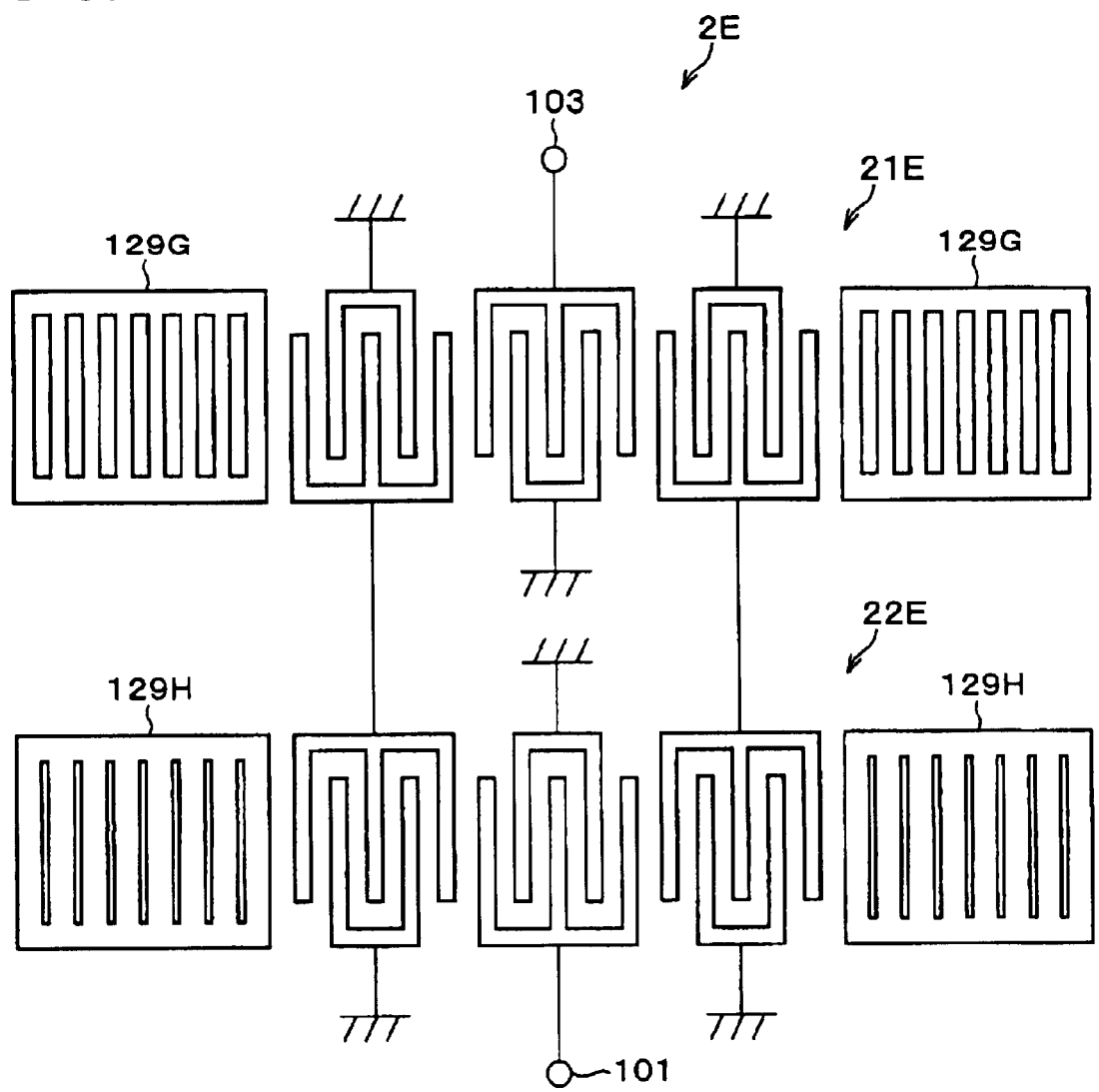
FIG. 14 is a schematic diagram showing the configuration of a SAW filter having a higher center frequency in a SAW device according to a fifth preferred embodiment of the present invention.

FIG. 14 shows a SAW filter 2E having a higher center frequency in a fifth preferred embodiment of the present invention. A feature of the fifth preferred embodiment is that the SAW filter 2E having the higher center frequency includes two cascade-connected SAW filter sections 21E and 22E, and that duties of the reflectors 129G and reflectors 129H in the two SAW filter sections 21E and 22E are different from each other, that is, the configurations of the reflectors 129G and 129H in the SAW filter sections 21E and 22E are different from each other.

The operations and advantages of the present invention will be described below. Since the SAW filter 2E shown in FIG. 14 has a relatively higher center frequency, similar to the first preferred embodiment, a spurious response in the proximity of a lower center frequency in the filter characteristics is greatly suppressed, such that the passband having the lower center frequency is greatly increased.

Figure 15:
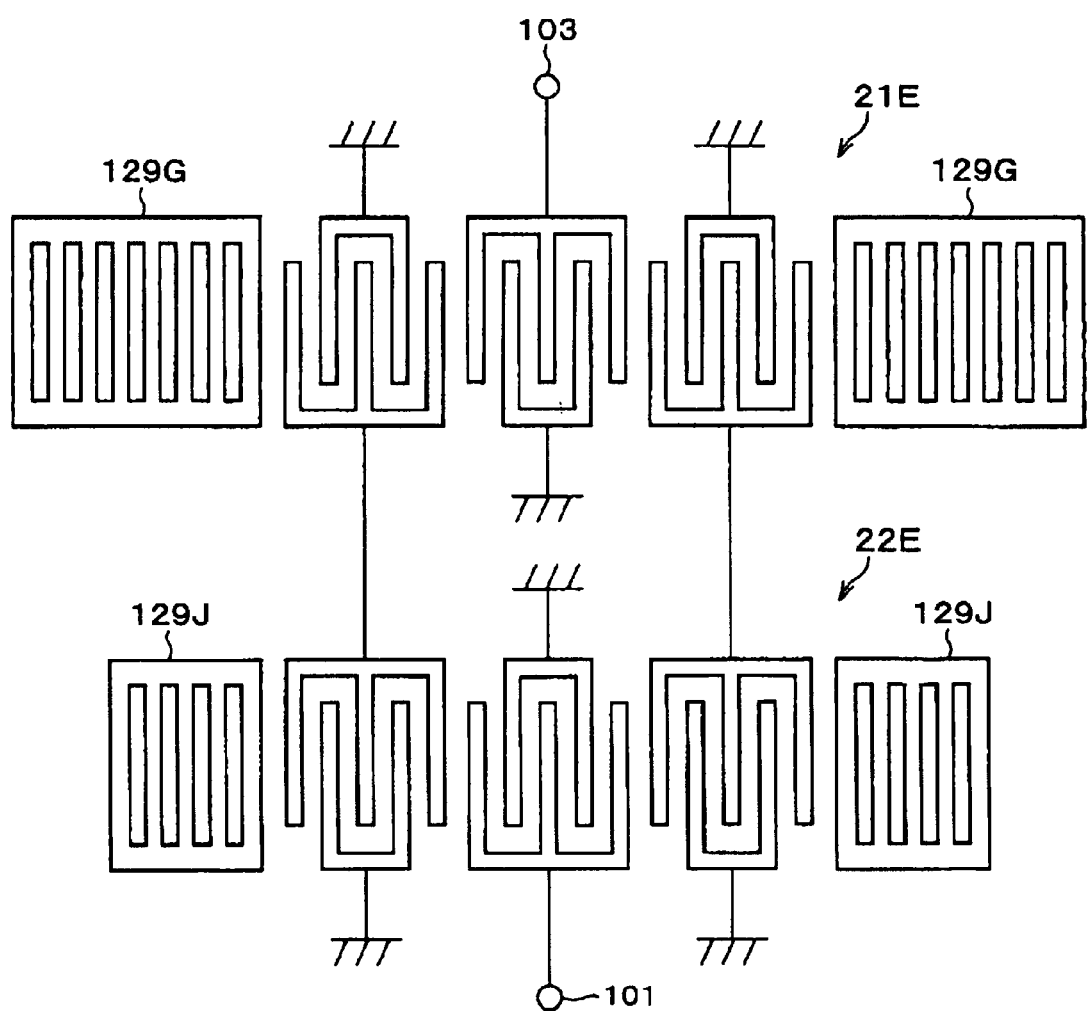
FIG. 15 is a schematic diagram showing a modification of the SAW filter according to the fifth preferred embodiment of the present invention.
Figure 16:
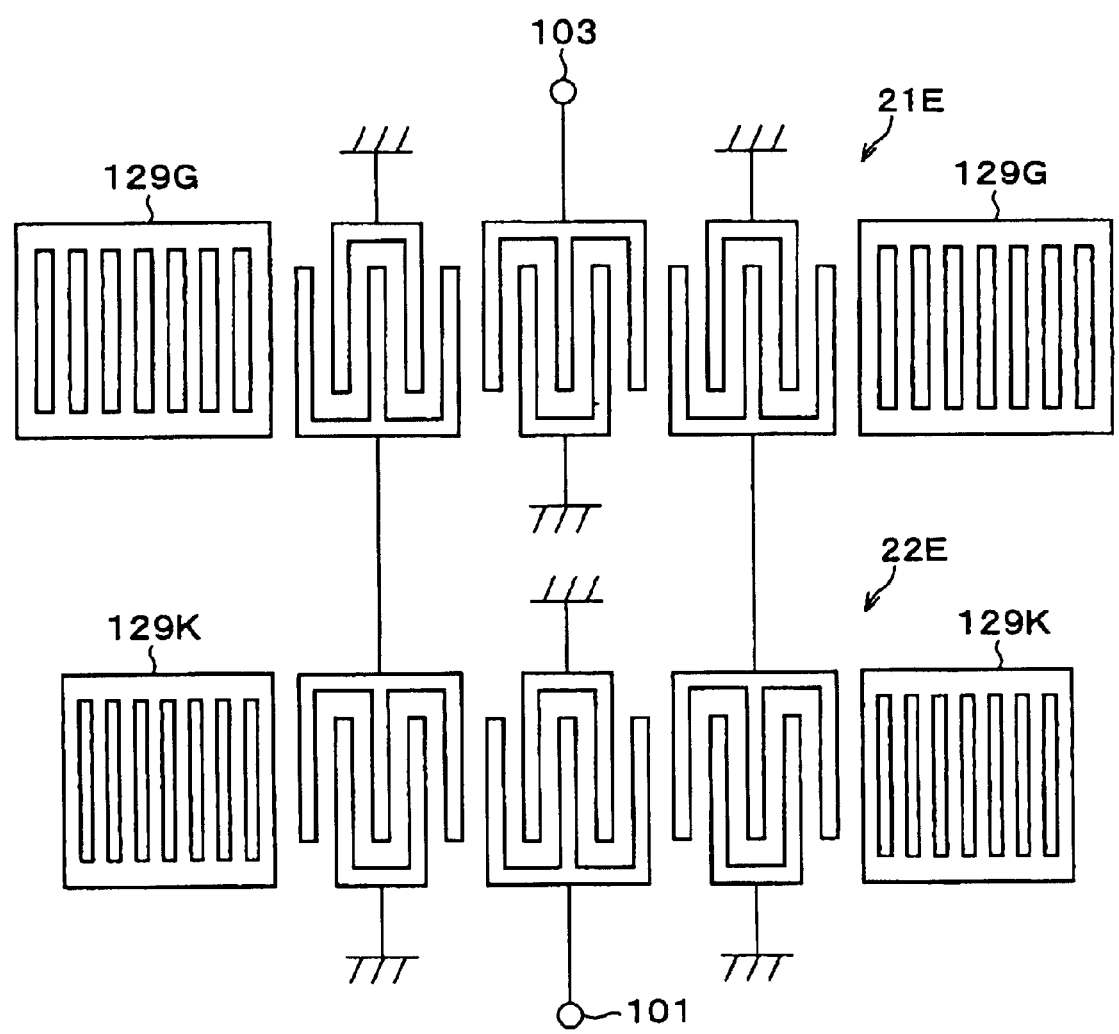
FIG. 16 is a schematic diagram showing another modification of the SAW filter according to the fifth preferred embodiment of the present invention.
Figure 17:
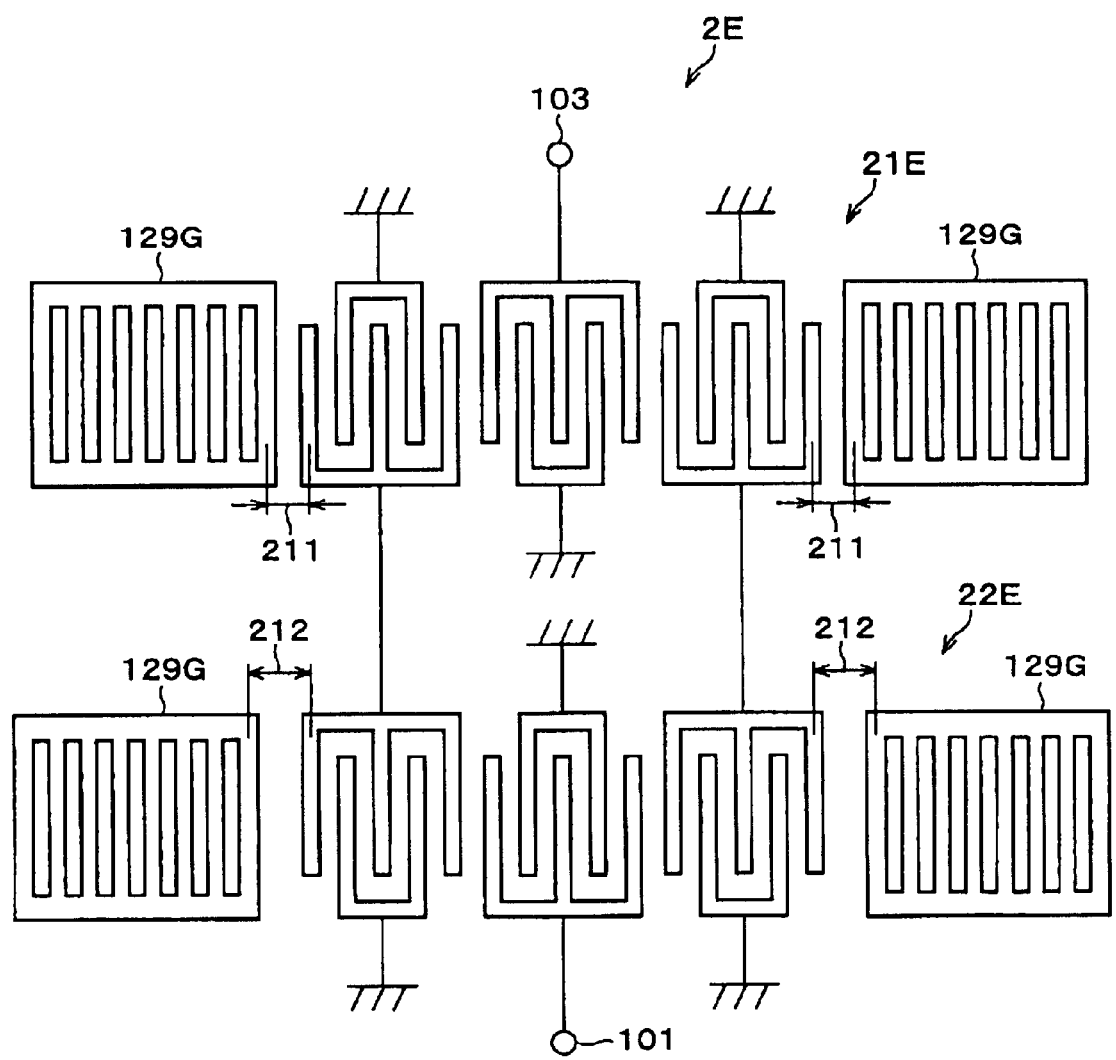
FIG. 17 is a schematic diagram showing yet another modification of the SAW filter according to the fifth preferred embodiment of the present invention.

As other examples of different configurations of the reflectors in the two SAW filter sections 21E and 22E, the arrangement may be such that the number of electrode fingers differs between reflectors 129G and 129J, as shown in FIG. 15, or the arrangement may be such that the pitch of electrode fingers differs between reflectors 129G and 129K, as shown in FIG. 16. The advantages can be similarly achieved even if distances 211 and 212 between the centers of outermost electrode fingers of reflectors 129G and IDTs adjacent thereto are different from each other, as shown in FIG. 17.

As described hereinabove, according to preferred embodiments of the present invention, configurations between left and right reflectors or between regions of reflectors in a SAW filter or SAW filter sections having a higher center frequency such that a spurious response associated with the SAW filter or SAW filter sections having the higher center frequency is greatly suppressed in a frequency band in the high-frequency side in or outside a passband of a SAW filter or SAW filter sections having a lower center frequency.

In other words, according to preferred embodiments of the present invention, using the configurations of the reflectors, the SAW filter or SAW filter sections having the higher center frequency greatly suppresses a spurious response in the low-frequency side outside the passband thereof.

Thus, according to the above-described arrangements, a spurious response in the SAW filter or SAW filter sections having the higher center frequency, which affects and narrows the passband of the SAW filter or SAW filter sections having the lower center frequency, is greatly suppressed, such that the passband is prevented from decreasing.

Although longitudinally coupled SAW resonator filters each having three IDTs have been used as examples of SAW filters and SAW filter sections in the preferred embodiments described hereinabove, without limitation thereto, the advantages of the present invention are similarly achieved using, for example, longitudinally coupled SAW resonator filters including two IDTs or four or more IDTs, transversely coupled SAW resonator filters, or transversal filters. However, a longitudinally coupled SAW resonator filter including a plurality of IDTs is preferred for a SAW filter having a higher center frequency.

Furthermore, although SAW resonators are connected in series in the preferred embodiments, SAW resonators may be connected in parallel, or two or more SAW resonators may be connected in series and in parallel.

Furthermore, although a 40±5° Y-cut X-propagating LiTaO$_3$ substrate is preferably used as the piezoelectric substrate 10 in the preferred embodiments, without limitation thereto, the advantages of the present invention are similarly achieved using a different type of piezoelectric substrate, including LiTaO$_3$ substrate having a different cutting angle, a LiNbO$_3$ substrate, or a crystal substrate.

Figure 18:
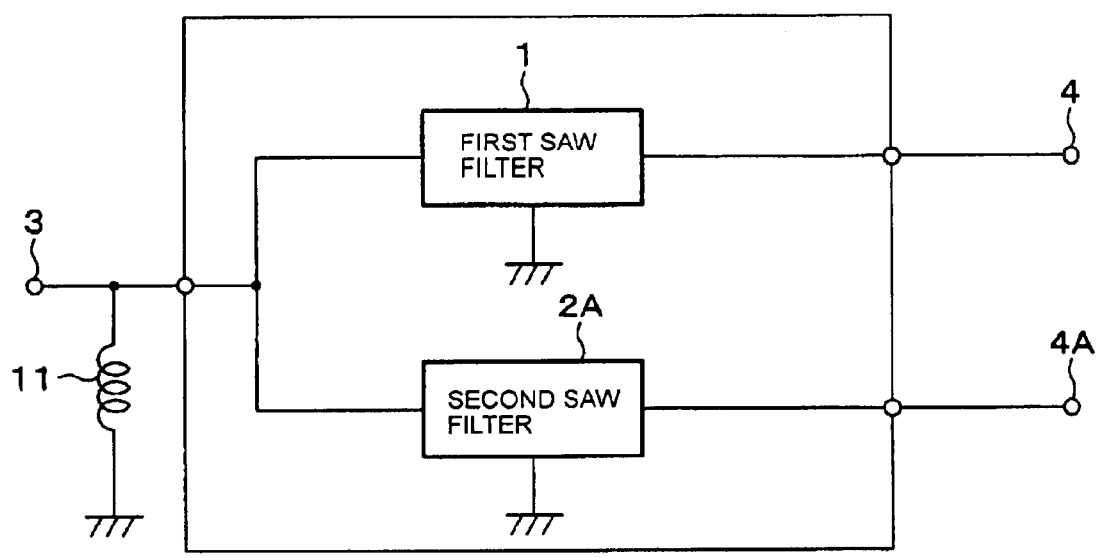
FIG. 18 is a circuit diagram of another SAW device according to a preferred embodiment of the present invention.
Figure 19:
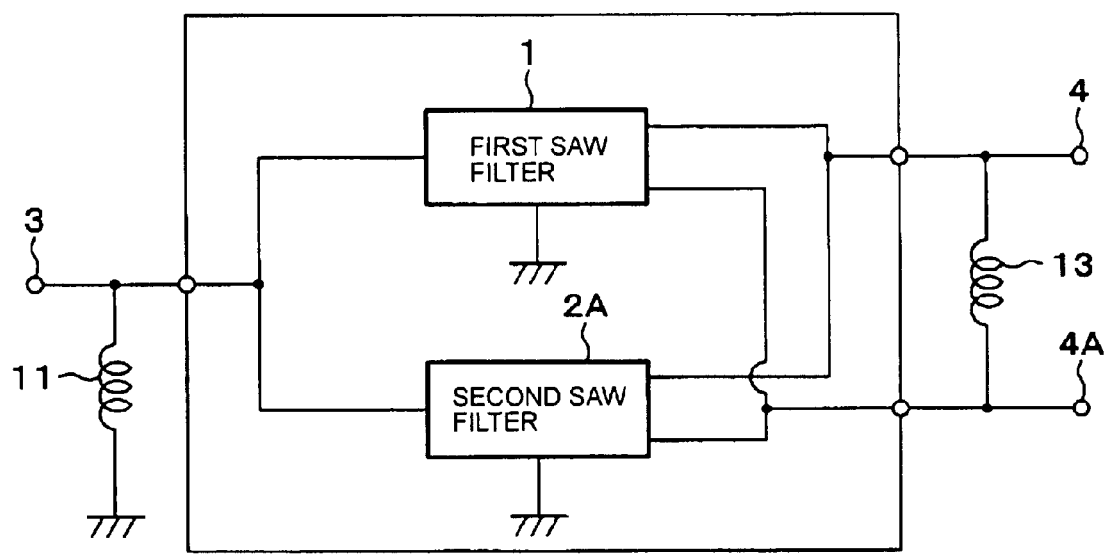
FIG. 19 is a circuit diagram of yet another SAW device according to a preferred embodiment of the present invention.
Figure 20:
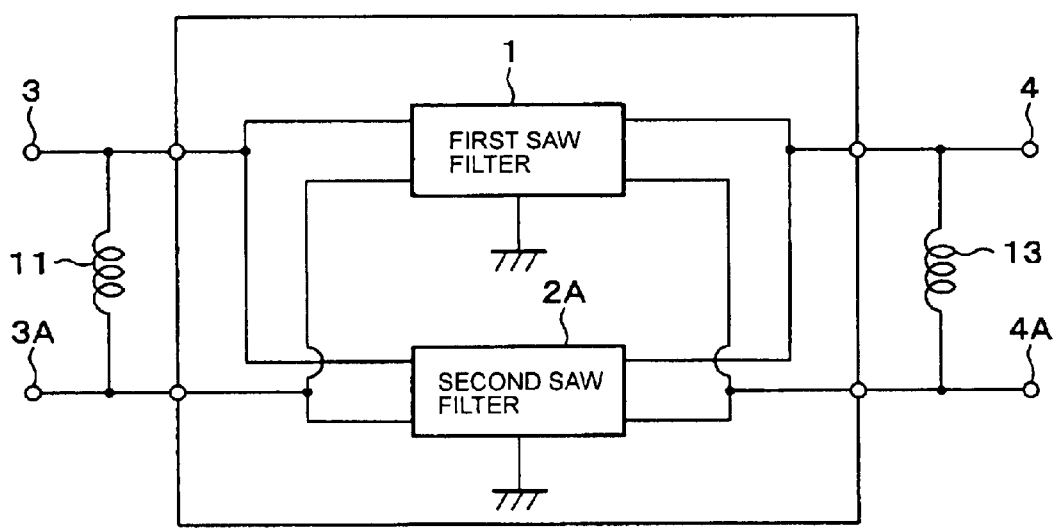
FIG. 20 is a circuit diagram of yet another SAW device according to a preferred embodiment of the present invention.
Figure 21:
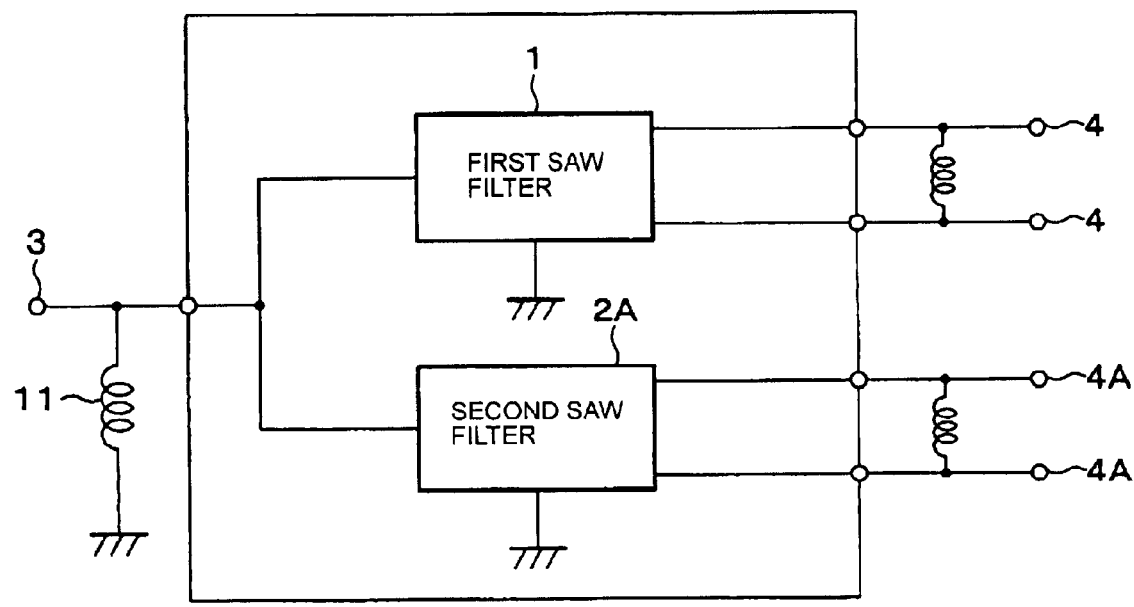
FIG. 21 is a circuit diagram of yet another SAW device according to a preferred embodiment of the present invention.
Figure 22:
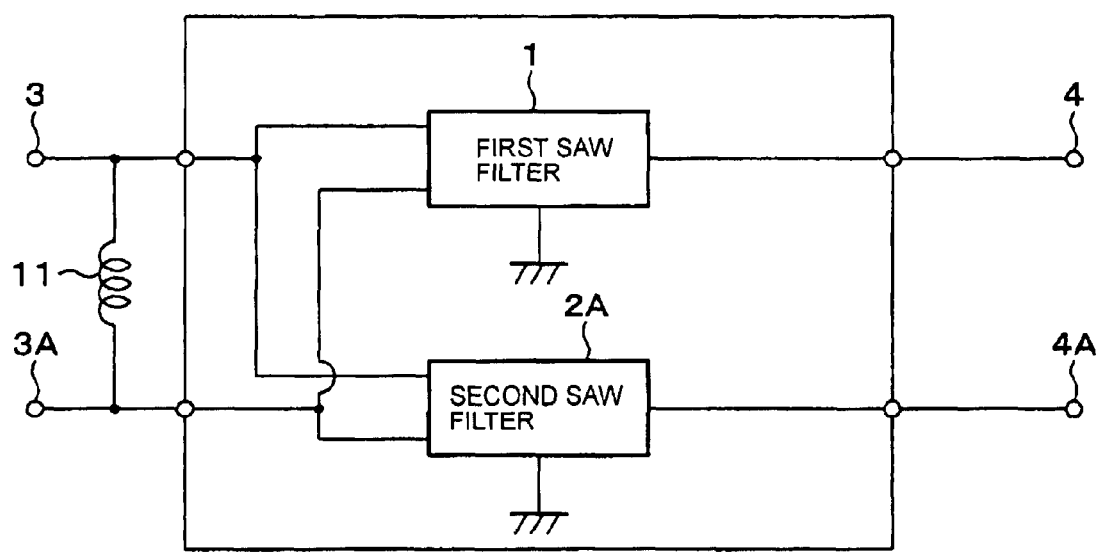
FIG. 22 is a circuit diagram of yet another SAW device according to a preferred embodiment of the present invention.
Figure 23:
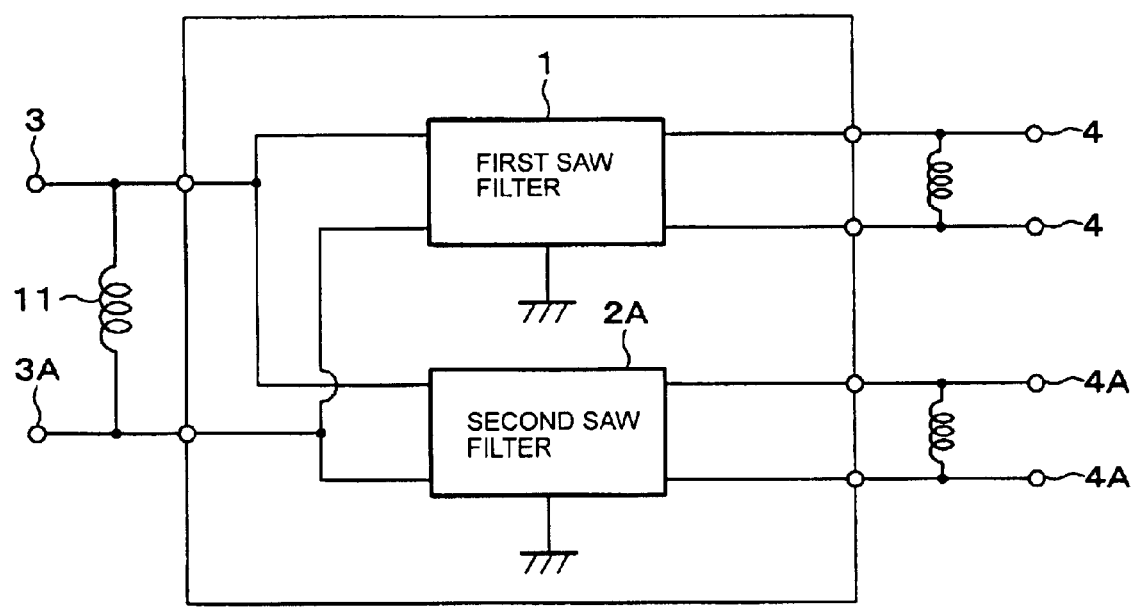
FIG. 23 is a circuit diagram of yet another SAW device according to a preferred embodiment of the present invention.
Figure 24:
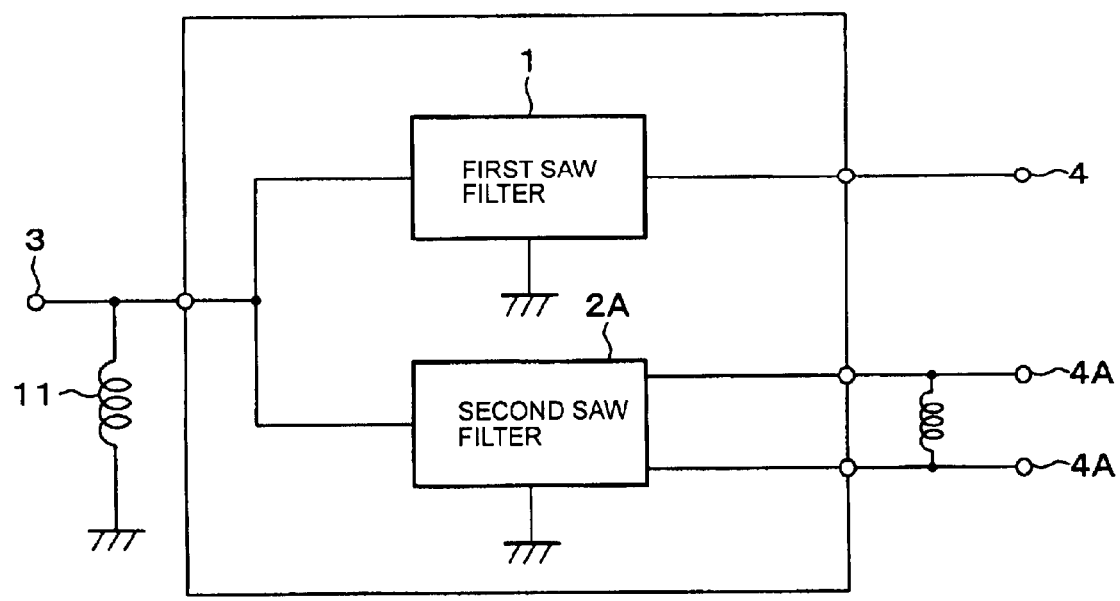
FIG. 24 is a circuit diagram of yet another SAW device according to a preferred embodiment of the present invention.

Although both input terminals and output terminals of two SAW filters are integrated in the SAW device according to the first preferred embodiment, the advantages of the present invention are similarly achieved by other arrangements. For example, the advantages of the present invention are similarly achieved by an arrangement shown in FIG. 18, in which either input terminals or output terminals of two SAW filters are integrated, by arrangements shown in FIGS. 19 and 20, in which the arrangement shown in FIG. 1 is modified such that either input terminals or output terminals, or both input terminals and output terminals are implemented by balanced signal terminals, and by arrangements shown in FIGS. 21 to 24 in which the arrangement shown in FIG. 18 is modified such that at least one of a plurality of input terminals and output terminals is implemented by balanced signal terminals.

Figure 25:
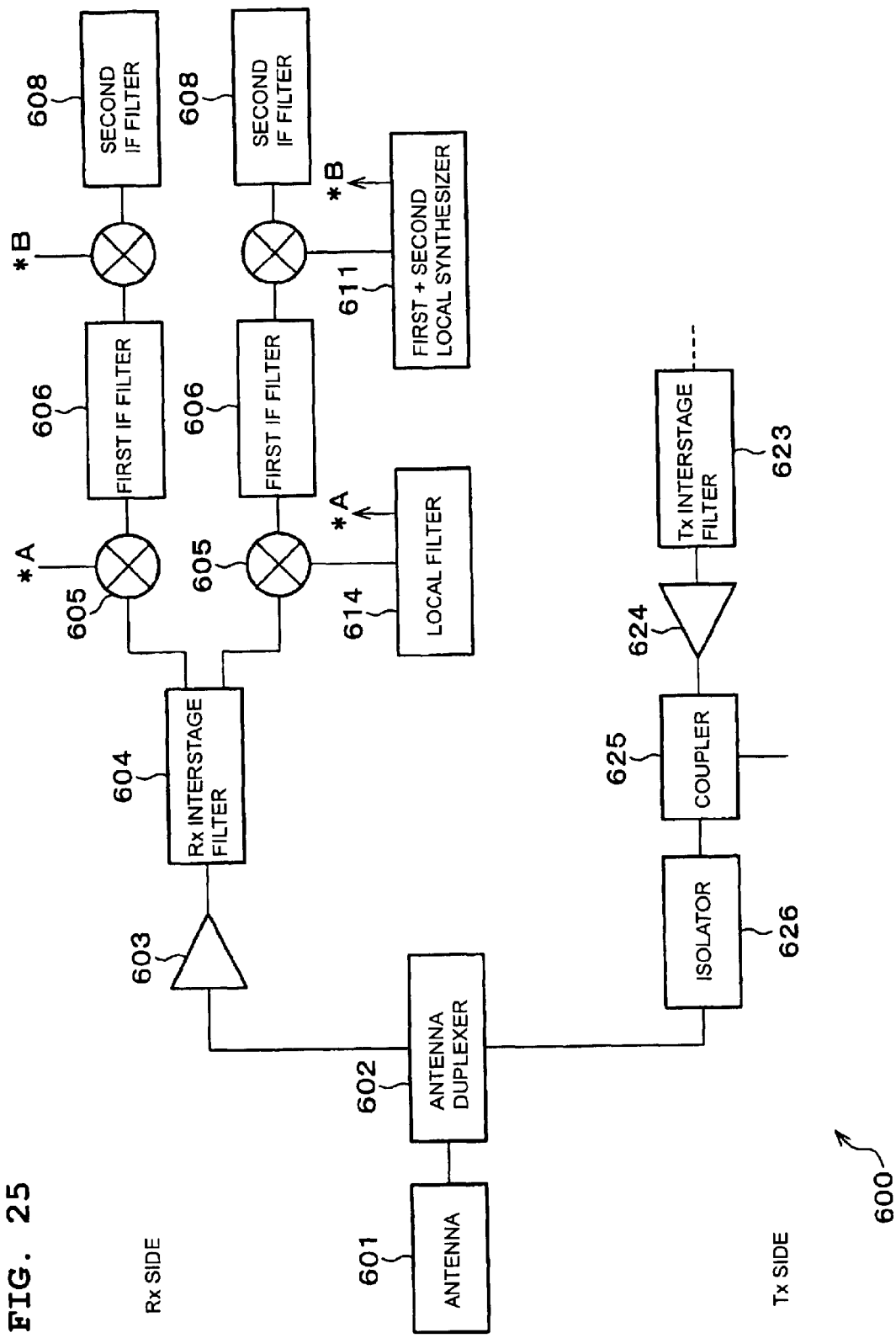
FIG. 25 is a block diagram of main parts of a communication apparatus according to another preferred embodiment of the present invention.

Next, a communication apparatus 600 including a SAW device according to preferred embodiments of the present invention will be described with reference to FIG. 25. The communication apparatus 600 includes, on the receiver (Rx) side, an antenna 601, an antenna duplexer/RF top filter 602, an amplifier 603, an Rx interstage filter 604, mixers 605, first IF filters 606, mixers 607, second IF filters 608, a first+second local synthesizer 611, and a local filter 614. Preferably, balanced signals are used for transmission between the Rx interstage filter 604 and the mixers 605 in order to assure balance, as indicated by two lines in FIG. 25.

Furthermore, the communication apparatus 600 includes, on the transmitter (Tx) side, the antenna 601 and the antenna duplexer/RF top filter 602 shared with the Rx side, a Tx interstage filter 623, an amplifier 624, a coupler 625, and an isolator 626. References "A" and "B" respectively denote the connections to each mixer according thereto.

SAW filters according to the preferred embodiments of the present invention, described hereinabove, are suitably used for the antenna duplexer/RF top filter 602, the Rx interstage filter 604, and the Tx interstage filter 623.

Accordingly, the communication apparatus includes SAW devices that have multiple functions and that are reduced in size, and exhibits favorable transmission characteristics (wide passbands and high attenuation outside the passbands), such that favorable transmission and reception characteristics and reduced size are achieved.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A surface acoustic wave device comprising:

a piezoelectric substrate;

a plurality of surface acoustic wave filters having input terminals, output terminals and different center frequencies are provided on the piezoelectric substrate, in which either the input terminals or the output terminals, or both the input terminals and the output terminals of the plurality of surface acoustic wave filters are integrated; wherein a surface acoustic wave filter of the plurality of surface acoustic wave filters having a higher center frequency is arranged to suppress a spurious response within a passband and/or in a proximity of a high-frequency side outside the passband a surface acoustic wave filter of the plurality of surface acoustic wave filters having a lower center frequency;

the surface acoustic wave filter having the higher center frequency includes an interdigital electrode transducer and reflectors sandwiching the interdigital electrode transducer; and the reflectors have at least one region that differs in at least one of width and pitch of electrode fingers from another region.

2. A surface acoustic wave device comprising:

a piezoelectric substrate;

a plurality of surface acoustic wave filters having input terminals, output terminals and different center frequencies are provided on the piezoelectric substrate, in which either the input terminals or the output terminals, or both th input terminals and the output terminals of the plurality of surface acoustic wave filters are integrated; wherein a surface acoustic wave filter of the plurality of surface acoustic wave filters having a higher center frequency is arranged to suppress a spurious response in a proximity of a low-frequency side outside a passband of the surface acoustic wave filter;

the surface acoustic wave filter having the higher center frequency includes an interdigital electrode transducer and reflectors sandwiching the interdigital electrode transducer; and the reflectors have at least one region that differs in at least one of width and pitch of electrode fingers from another region.

3. A surface acoustic wave device according to claim 1, wherein the surface acoustic wave filter having the higher center frequency is a longitudinally coupled surface acoustic wave resonator filter.

4. A surface acoustic wave device according to claim 1, wherein the surface acoustic wave filter having the higher center frequency includes an interdigital electrode transducer and reflectors sandwiching the interdigital electrode transducer, the reflectors are divided into at least two regions, and at least one of the divided regions differs in duty from another of the divided regions.

5. A surface acoustic wave device according to claim 1, wherein the surface acoustic wave filter having the higher center frequency includes an interdigital electrode transducer and reflectors sandwiching the interdigital electrode transducer, and electrode fingers of the reflectors vary in length in accordance with a distance from the interdigital electrode transducer.

6. A surface acoustic wave device according to claim 1, wherein the surface acoustic wave filter having the higher center frequency includes a first reflector and a second reflector that have different configurations from each other, and an interdigital electrode transducer sandwiched by the first and second reflectors.

7. A surface acoustic wave device according to claim 6, wherein the first and second reflectors differ in duty from each other.

8. A surface acoustic wave device according to claim 6, wherein the first and second reflectors differ in number of electrode fingers from each other.

9. A surface acoustic wave device according to claim 6, wherein the first and second reflectors differ in pitch of electrode fingers from each other.

10. A surface acoustic wave device according to claim 6, wherein distances between centers of outermost electrode fingers of the first and second reflectors and interdigital electrode transducers respectively adjacent thereto differ from each other.

11. A surface acoustic wave device according to claim 1, wherein the surface acoustic wave filter having the higher center frequency includes at least two surface acoustic wave filter sections cascade-connected with each other, each including an interdigital electrode transducer and reflectors sandwiching the interdigital electrode transducer, and the reflectors differ in configuration among the cascade-connected surface acoustic wave filter sections.

12. A surface acoustic wave device according to claim 11, wherein the reflectors differ in duty among the cascade-connected surface acoustic wave filter sections.

13. A surface acoustic wave device according to claim 11, wherein the reflectors differ in number of electrode fingers among the cascade-connected surface acoustic wave filter sections.

14. A surface acoustic wave device according to claim 11, wherein the reflectors differ in pitch of electrode fingers among the cascade-connected surface acoustic wave filter sections.

15. A surface acoustic wave device according to claim 11, wherein distances between centers of outermost electrode fingers of the reflectors and interdigital electrode transducers respectively adjacent thereto differ among the cascade-connected surface acoustic wave filter sections.

16. A surface acoustic wave device according to claim 1, wherein at least one surface acoustic wave resonator is connected between the integrated terminal and the plurality of surface acoustic wave filters.

17. A surface acoustic wave device according to claim 1, wherein an inductance element is arranged substantially parallel to the integrated terminal.

18. A communication apparatus comprising a surface acoustic wave device according to claim 1.

19. A communication apparatus comprising a surface acoustic wave device according to claim 2.

* * * * *